(12) United States Patent
Hellings et al.

(10) Patent No.: US 11,114,435 B2
(45) Date of Patent: Sep. 7, 2021

(54) FINFET HAVING LOCALLY HIGHER FIN-TO-FIN PITCH

(71) Applicants: IMEC VZW, Leuven (BE); Katholieke Universiteit Leuven, Leuven (BE)

(72) Inventors: Geert Hellings, Halle (BE); Roman Boschke, Leuven (BE); Dimitri Linten, Boortmeerbeek (BE); Naoto Horiguchi, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 15/382,376

(22) Filed: Dec. 16, 2016

(65) Prior Publication Data

US 2017/0207217 A1 Jul. 20, 2017

(30) Foreign Application Priority Data

Dec. 16, 2015 (EP) .................................... 15200415

(51) Int. Cl.
*H01L 27/088* (2006.01)
*H01L 29/78* (2006.01)
(Continued)

(52) U.S. Cl.
CPC .. *H01L 27/0886* (2013.01); *H01L 21/823431* (2013.01); *H01L 21/823481* (2013.01); *H01L 29/0649* (2013.01); *H01L 29/41791* (2013.01); *H01L 29/66795* (2013.01); *H01L 29/785* (2013.01); *H01L 29/7851* (2013.01)

(58) Field of Classification Search
CPC ..... H01L 21/823431; H01L 21/823481; H01L 27/0886; H01L 29/0649; H01L 29/41791; H01L 29/66795; H01L 29/785; H01L 29/7851
See application file for complete search history.

(56) References Cited

U.S. PATENT DOCUMENTS 6,949,768 B1 * 9/2005 Anderson ....... H01L 21/823821
257/24
7,501,674 B2 * 3/2009 Lee ................. H01L 21/823431
257/288

(Continued)

OTHER PUBLICATIONS

European Search Report dated Jun. 2, 2016 in European Patent Application No. 15200415.6.

*Primary Examiner* — Jay C Kim
(74) *Attorney, Agent, or Firm* — Knobbe, Martens, Olson & Bear, LLP

(57) ABSTRACT

The disclosed technology generally relates to semiconductor devices, and more particularly to FinFET transistors. In one aspect, at least three fins are arranged to extend in parallel in a first direction and are laterally separated from each other in a second direction by shallow trench isolation structures having a first fin spacing, where at least a portion of each fin protrudes out from a substrate. At least a portion of each of a first fin and a second fin of the at least three fins vertically protrude to a level higher than an upper surface of the shallow trench isolation structures. A third fin is formed laterally between the first fin and the second fin in the second direction, where the third fin has a non-protruding region which extends vertically to a level below or equal to the upper surface of the shallow trench isolation structures.

17 Claims, 19 Drawing Sheets

(51) Int. Cl.
*H01L 21/8234* (2006.01)
*H01L 29/06* (2006.01)
*H01L 29/417* (2006.01)
*H01L 29/66* (2006.01)

(56) References Cited

U.S. PATENT DOCUMENTS

| | | | | |
|---|---|---|---|---|
| 7,547,947 B2 * | 6/2009 | Anderson | H01L 27/11 | 257/369 |
| 7,560,785 B2 * | 7/2009 | Yu | H01L 29/66795 | 257/330 |
| 7,638,843 B2 * | 12/2009 | Xiong | H01L 21/845 | 257/347 |
| 7,692,254 B2 * | 4/2010 | Anderson | H01L 29/41791 | 257/328 |
| 7,833,867 B2 * | 11/2010 | Fujimoto | H01L 21/823431 | 438/294 |
| 7,834,391 B2 * | 11/2010 | Kang | G11C 16/0483 | 257/316 |
| 7,843,000 B2 * | 11/2010 | Yu | H01L 29/66795 | 257/330 |
| 7,851,276 B2 * | 12/2010 | Yang | H01L 27/1203 | 438/149 |
| 7,888,750 B2 * | 2/2011 | Anderson | H01L 29/785 | 257/330 |
| 8,022,478 B2 * | 9/2011 | Anderson | H01L 29/785 | 257/264 |
| 8,039,326 B2 * | 10/2011 | Knorr | H01L 21/76232 | 257/E21.63 |
| 8,193,567 B2 * | 6/2012 | Kavalieros | H01L 21/823807 | 257/288 |
| 8,242,568 B2 * | 8/2012 | Ikeda | H01L 29/045 | 257/401 |
| 8,263,462 B2 * | 9/2012 | Hung | H01L 29/66795 | 438/286 |
| 8,367,498 B2 * | 2/2013 | Chang | H01L 29/7848 | 438/268 |
| 8,441,074 B2 * | 5/2013 | Rachmady | H01L 21/76232 | 257/365 |
| 8,460,984 B2 * | 6/2013 | Wahl | H01L 22/20 | 438/164 |
| 8,481,341 B2 * | 7/2013 | Clark | H01L 21/02532 | 257/E21.09 |
| 8,487,399 B2 * | 7/2013 | Cho | H01L 29/7851 | 257/506 |
| 8,501,607 B1 * | 8/2013 | Juengling | H01L 29/66795 | 438/587 |
| 8,519,481 B2 * | 8/2013 | Yuan | H01L 21/76224 | 257/368 |
| 8,541,270 B2 * | 9/2013 | Yeh | H01L 29/66795 | 438/197 |
| 8,574,995 B2 * | 11/2013 | Jeng | H01L 21/823431 | 438/305 |
| 8,580,642 B1 * | 11/2013 | Maszara | H01L 29/66795 | 438/157 |
| 8,592,263 B2 * | 11/2013 | Standaert | H01L 21/845 | 438/157 |
| 8,603,893 B1 * | 12/2013 | Wei | H01L 21/76229 | 257/E21.546 |
| 8,609,497 B2 * | 12/2013 | Chung | H01L 29/66636 | 438/299 |
| 8,610,241 B1 * | 12/2013 | Hu | H01L 27/0629 | 257/353 |
| 8,617,996 B2 * | 12/2013 | Chi | H01L 21/30604 | 257/E21.377 |
| 8,624,326 B2 * | 1/2014 | Chen | H01L 29/66795 | 257/369 |
| 8,629,039 B2 * | 1/2014 | Rachmady | H01L 21/76232 | 257/365 |
| 8,658,536 B1 * | 2/2014 | Choi | H01L 21/308 | 257/E21.409 |
| 8,692,321 B2 * | 4/2014 | Ryu | H01L 29/7827 | 257/330 |
| 8,697,515 B2 * | 4/2014 | Yin | H01L 21/823821 | 257/E21.409 |
| 8,735,993 B2 * | 5/2014 | Lo | H01L 27/0255 | 257/347 |
| 8,753,940 B1 * | 6/2014 | Wei | H01L 21/823431 | 257/E21.429 |
| 8,759,184 B2 * | 6/2014 | Ho | H01L 29/66795 | 438/296 |
| 8,802,521 B1 * | 8/2014 | Hung | H01L 29/6681 | 257/347 |
| 8,815,685 B2 * | 8/2014 | LiCausi | H01L 21/76224 | 438/269 |
| 8,815,742 B2 * | 8/2014 | Cai | H01L 29/785 | 438/700 |
| 8,835,268 B2 * | 9/2014 | Sudo | H01L 27/228 | 257/E21.619 |
| 8,836,016 B2 * | 9/2014 | Wu | H01L 29/66795 | 257/329 |
| 8,896,067 B2 * | 11/2014 | Bergendahl | H01L 21/823431 | 257/368 |
| 8,928,057 B2 * | 1/2015 | Cote | H01L 21/845 | 257/296 |
| 8,946,829 B2 * | 2/2015 | Wann | H01L 21/823821 | 257/288 |
| 8,963,257 B2 * | 2/2015 | Wann | H01L 29/66818 | 257/401 |
| 8,963,259 B2 * | 2/2015 | Jacob | H01L 21/761 | 257/328 |
| 8,987,836 B2 * | 3/2015 | Kim | H01L 29/785 | 257/288 |
| 8,993,399 B2 * | 3/2015 | Cheng | H01L 21/76224 | 438/268 |
| 9,012,286 B2 * | 4/2015 | Chi | H01L 21/823821 | 257/365 |
| 9,054,212 B2 * | 6/2015 | Juengling | H01L 21/823431 | |
| 9,082,850 B2 * | 7/2015 | Kim | H01L 27/10876 | |
| 9,087,725 B2 * | 7/2015 | Lee | H01L 21/76 | |
| 9,093,533 B2 * | 7/2015 | Cheng | H01L 29/785 | |
| 9,112,052 B2 * | 8/2015 | Chen | H01L 29/0649 | |
| 9,166,010 B2 * | 10/2015 | Kelly | H01L 29/785 | |
| 9,171,752 B1 * | 10/2015 | Wu | H01L 21/76224 | |
| 9,171,929 B2 * | 10/2015 | Lee | H01L 21/02532 | |
| 9,178,043 B2 * | 11/2015 | Fung | H01L 29/66795 | |
| 9,190,496 B2 * | 11/2015 | Lin | H01L 29/66795 | |
| 9,202,920 B1 * | 12/2015 | Liu | H01L 29/785 | |
| 9,209,172 B2 * | 12/2015 | Cheng | H01L 21/762 | |
| 9,209,178 B2 * | 12/2015 | Kanakasabapathy | H01L 27/0886 | |
| 9,209,202 B2 * | 12/2015 | Ponoth | H01L 21/76224 | |
| 9,214,358 B1 * | 12/2015 | Lin | H01L 29/66 | |
| 9,257,325 B2 * | 2/2016 | Knorr | H01L 21/76229 | |
| 9,257,327 B2 * | 2/2016 | Rodder | H01L 21/76243 | |
| 9,257,505 B2 * | 2/2016 | Lai | H01L 21/76224 | |
| 9,287,262 B2 * | 3/2016 | Chen | H01L 21/823481 | |
| 9,287,385 B2 * | 3/2016 | Liu | H01L 21/823431 | |
| 9,299,775 B2 * | 3/2016 | Bentley | H01L 29/0649 | |
| 9,299,843 B2 * | 3/2016 | Wang | H01L 29/66795 | |
| 9,318,367 B2 * | 4/2016 | Huang | H01L 27/0924 | |
| 9,318,488 B2 * | 4/2016 | Wu | H01L 29/785 | |
| 9,324,799 B2 * | 4/2016 | Sung | H01L 29/1033 | |
| 9,331,074 B1 * | 5/2016 | Chang | H01L 27/0886 | |
| 9,337,101 B1 * | 5/2016 | Sung | H01L 21/3083 | |
| 9,337,258 B2 * | 5/2016 | Wang | H01L 21/76224 | |
| 9,356,046 B2 * | 5/2016 | Cheng | H01L 27/1211 | |
| 9,362,181 B1 * | 6/2016 | Xie | H01L 21/823878 | |
| 9,362,404 B2 * | 6/2016 | Chen | H01L 29/7851 | |
| 9,397,099 B1 * | 7/2016 | Huang | H01L 29/785 | |
| 9,418,902 B2 * | 8/2016 | Cheng | H01L 29/66795 | |
| 9,418,994 B1 * | 8/2016 | Chao | H01L 29/6681 | |
| 9,425,314 B2 * | 8/2016 | Merckling | H01L 21/02532 | |
| 9,478,544 B2 * | 10/2016 | Mitard | H01L 21/823821 | |
| 9,508,743 B2 * | 11/2016 | Singh | H01L 27/1211 | |
| 9,515,184 B2 * | 12/2016 | Chiang | H01L 27/0886 | |
| 9,530,654 B2 * | 12/2016 | Licausi | H01L 21/30625 | |
| 9,530,868 B2 * | 12/2016 | Huang | H01L 21/3065 | |

(56) References Cited

U.S. PATENT DOCUMENTS

| | | | |
|---|---|---|---|
| 9,548,216 B1* | 1/2017 | Chen | H01L 21/2253 |
| 9,570,580 B1* | 2/2017 | Chiang | H01L 21/31055 |
| 9,589,845 B1* | 3/2017 | Jagannathan | H01L 29/7851 |
| 9,589,848 B2* | 3/2017 | Cheng | H01L 29/785 |
| 9,595,475 B2* | 3/2017 | Liaw | H01L 21/3086 |
| 9,607,985 B1* | 3/2017 | Tseng | H01L 27/0886 |
| 9,613,954 B2* | 4/2017 | Basker | H01L 21/32134 |
| 9,627,538 B2* | 4/2017 | Wu | H01L 21/76229 |
| 9,633,905 B2* | 4/2017 | Chen | H01L 21/823481 |
| 9,666,474 B2* | 5/2017 | Briggs | H01L 21/31055 |
| 9,685,380 B2* | 6/2017 | Loubet | H01L 21/823807 |
| 9,704,751 B1* | 7/2017 | Chang | H01L 21/823821 |
| 9,704,752 B1* | 7/2017 | Chang | H01L 21/3083 |
| 9,704,974 B2* | 7/2017 | Chang | H01L 29/66795 |
| 9,722,050 B2* | 8/2017 | Li | H01L 21/302 |
| 9,748,387 B2* | 8/2017 | Jacob | H01L 29/7848 |
| 9,893,061 B2* | 2/2018 | Liu | H01L 29/22 |
| 9,905,467 B2* | 2/2018 | Li | H01L 21/31116 |
| 9,941,271 B2* | 4/2018 | Ponoth | H01L 27/0629 |
| 9,947,656 B2* | 4/2018 | Chung | H01L 27/0886 |
| 9,991,256 B2* | 6/2018 | Chang | H01L 29/0692 |
| 9,997,414 B2* | 6/2018 | Glass | H01L 21/823821 |
| 10,032,869 B2* | 7/2018 | Wang | H01L 29/7854 |
| 10,056,467 B2* | 8/2018 | Feng | H01L 27/0886 |
| 10,115,721 B2* | 10/2018 | Hafez | H01L 27/0886 |
| 10,147,805 B2* | 12/2018 | Chen | H01L 21/76232 |
| 10,164,016 B2* | 12/2018 | Peng | H01L 27/0886 |
| 10,199,499 B2* | 2/2019 | Kim | H01L 27/0207 |
| 10,229,997 B2* | 3/2019 | Mohapatra | H01L 29/66795 |
| 10,418,464 B2* | 9/2019 | Glass | H01L 21/823821 |
| 10,658,509 B2* | 5/2020 | Lin | H01L 21/823431 |
| 10,679,950 B2* | 6/2020 | Kuan | H01L 29/24 |
| 2008/0157225 A1* | 7/2008 | Datta | H01L 27/105 257/401 |
| 2008/0277739 A1* | 11/2008 | Curatola | H01L 21/823481 257/393 |
| 2009/0057846 A1* | 3/2009 | Doyle | H01L 21/823431 257/623 |
| 2009/0321834 A1* | 12/2009 | Rachmady | H01L 21/76232 257/365 |
| 2011/0147848 A1* | 6/2011 | Kuhn | H01L 21/76229 257/368 |
| 2013/0020640 A1* | 1/2013 | Chen | H01L 29/66795 257/347 |
| 2013/0065326 A1 | 3/2013 | Sudo | |
| 2013/0175584 A1 | 7/2013 | Ho et al. | |
| 2013/0309838 A1 | 11/2013 | Wei et al. | |
| 2014/0197456 A1* | 7/2014 | Wang | H01L 29/785 257/192 |
| 2014/0264488 A1* | 9/2014 | Fronheiser | H01L 29/66795 257/288 |
| 2014/0374838 A1* | 12/2014 | Chen | H01L 27/0886 257/401 |
| 2015/0060959 A1 | 3/2015 | Lin et al. | |
| 2015/0064889 A1* | 3/2015 | Paraschiv | H01L 21/823431 438/514 |
| 2015/0145068 A1* | 5/2015 | Chen | H01L 29/785 257/401 |
| 2015/0171217 A1* | 6/2015 | Kim | H01L 21/823431 257/401 |
| 2015/0206759 A1* | 7/2015 | Tsao | H01L 29/0657 257/506 |
| 2015/0206954 A1 | 7/2015 | Lin | |
| 2015/0249127 A1* | 9/2015 | Xie | H01L 29/0692 438/437 |
| 2015/0380526 A1* | 12/2015 | Godet | H01L 29/66795 438/482 |
| 2016/0013183 A1* | 1/2016 | Basker | H01L 21/823431 257/401 |
| 2016/0260636 A1* | 9/2016 | Lin | H01L 21/823412 |

* cited by examiner

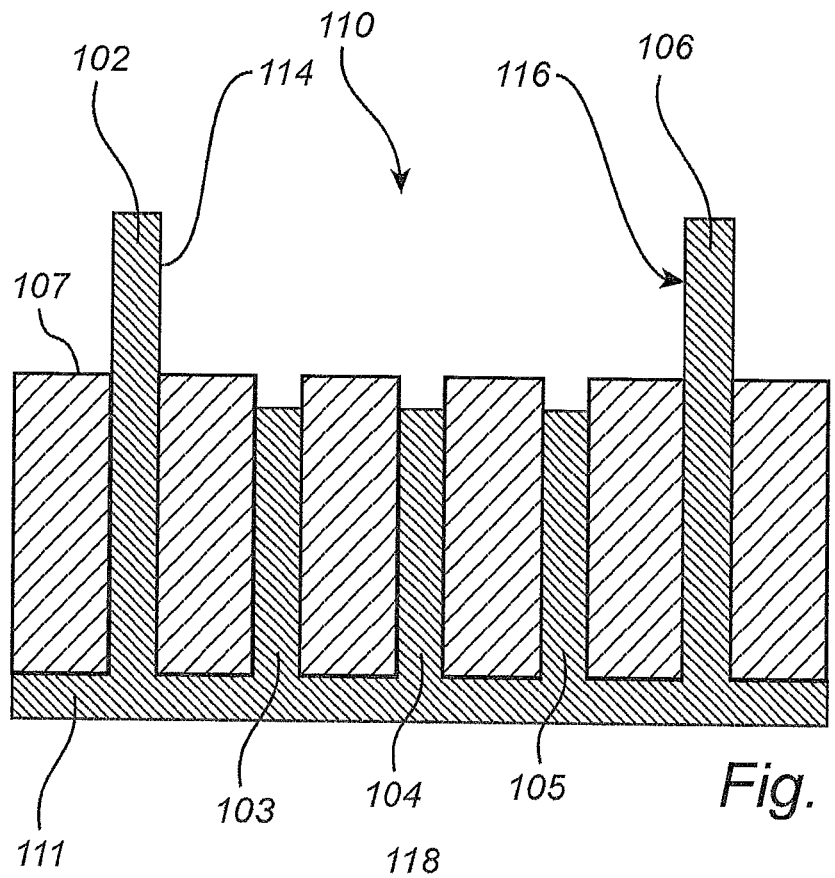
Fig. 4a´
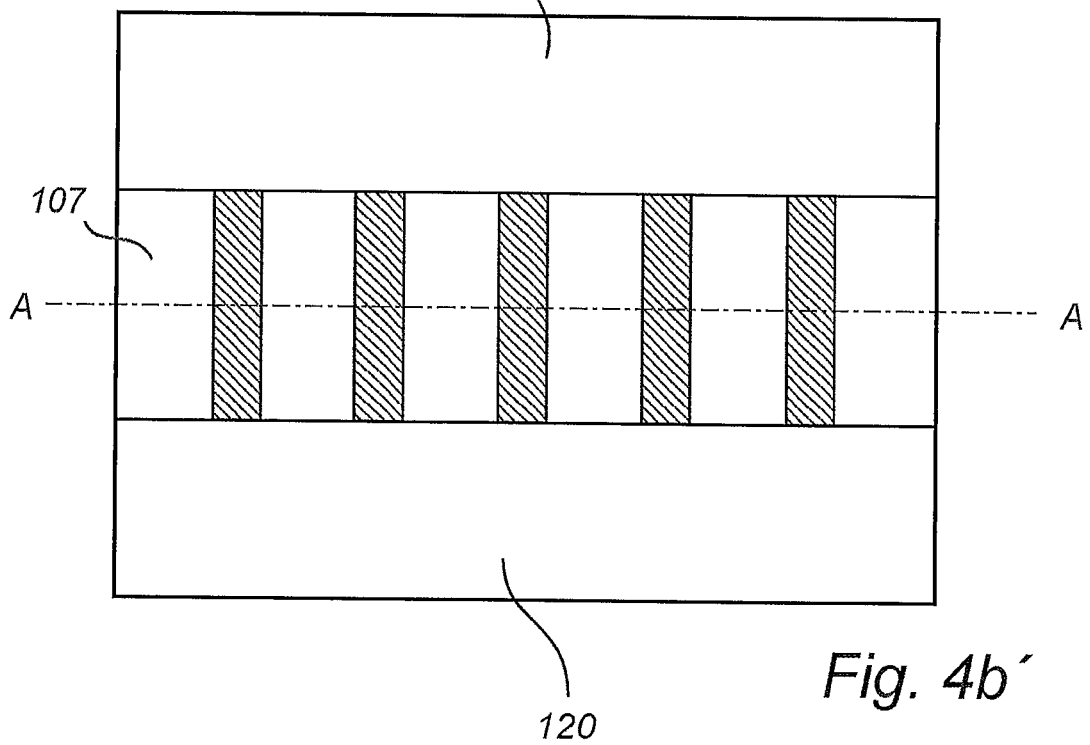
Fig. 4b´

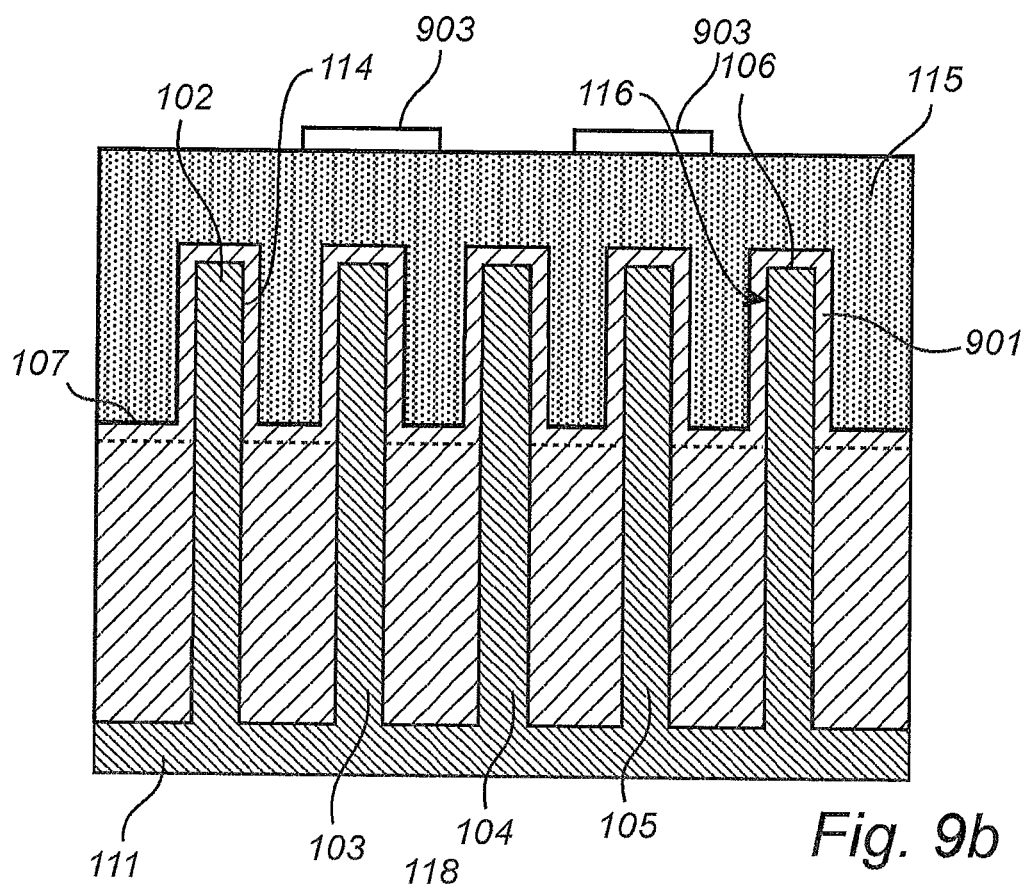
*Fig. 9b*
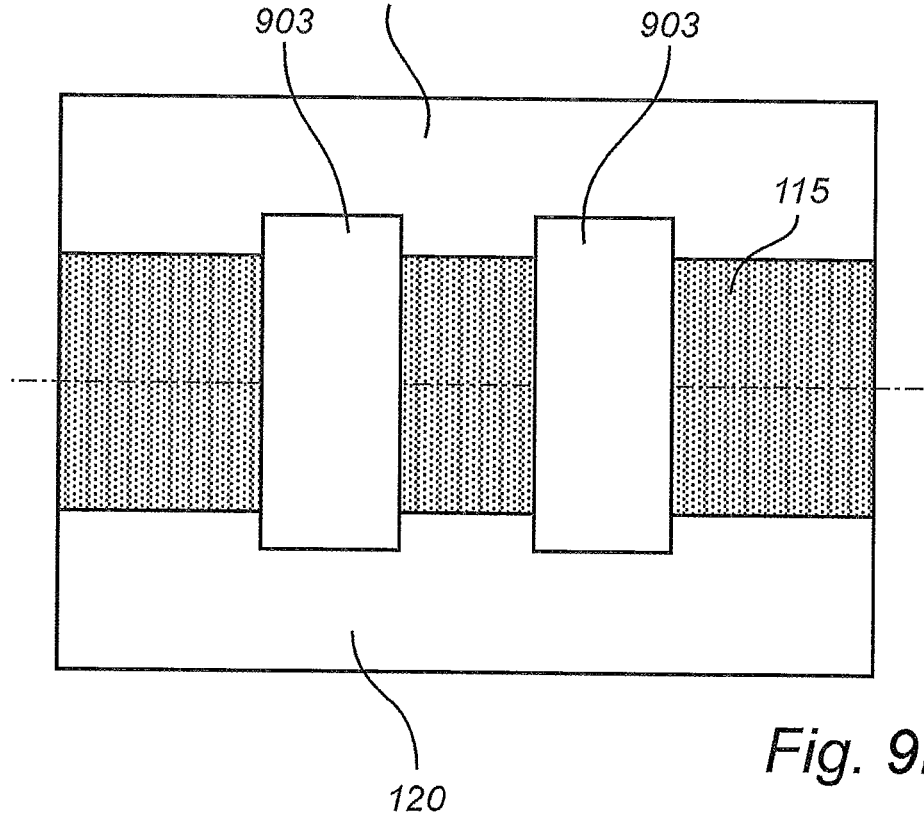
*Fig. 9b´*

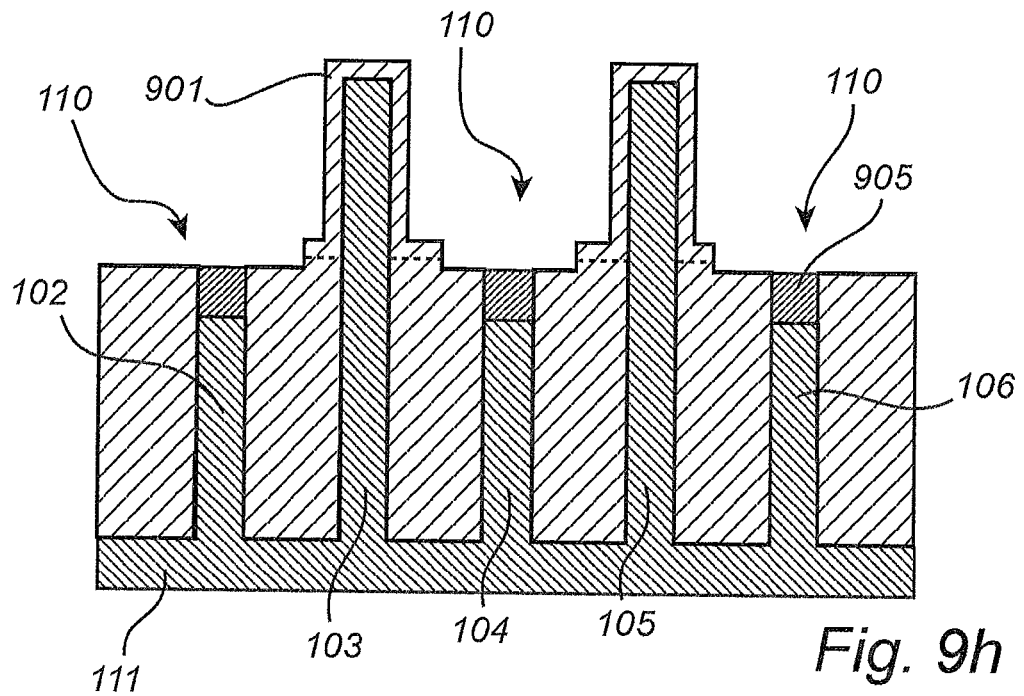
Fig. 9h
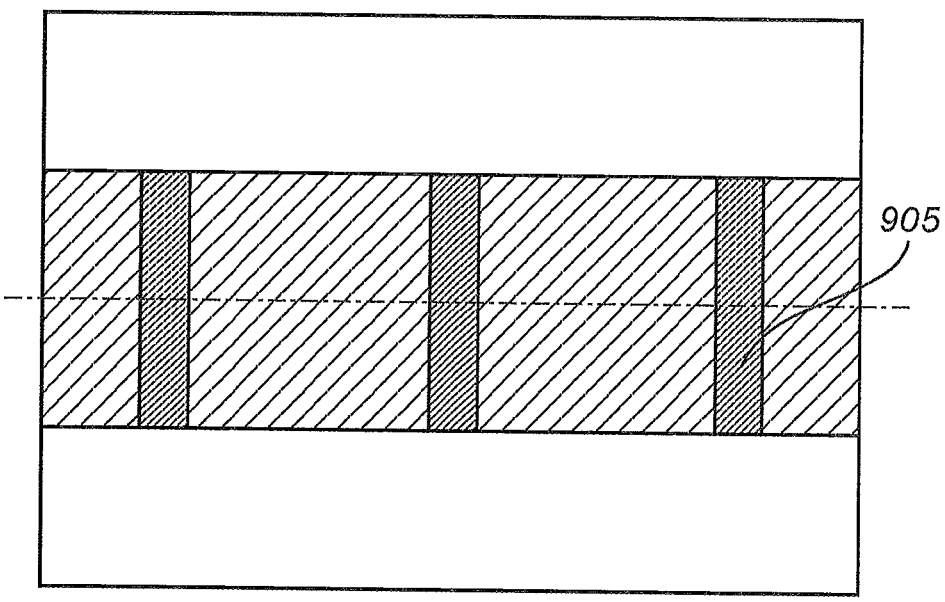
Fig. 9h´

FINFET HAVING LOCALLY HIGHER FIN-TO-FIN PITCH

CROSS-REFERENCE TO RELATED APPLICATIONS

This application claims foreign priority to European Patent Application No. EP 15200415.6, filed Dec. 16, 2015, the content of which is incorporated by reference herein in its entirety.

BACKGROUND

Field

The disclosed technology generally relates to semiconductor devices, and more particularly to FinFET transistors.

Description of the Related Technology

The technological drive to increase the number of transistors per area with each new generation of semiconductor chips, e.g., microprocessors, continues. While this leads to an ever-increasing density of transistors in the semiconductor chips, there is a corresponding increase in the number and complexity of manufacturing challenges.

In various semiconductor chips, there are several types of transistors. Some types of transistors, for example CORE transistors or I/O transistors, may be fabricated using a FinFET process technology. In FinFET process technologies, semiconductor fins having a certain pitch are formed, and thereafter a gate dielectric and a gate electrode are formed on the fins. The fin defines the conduction channel between the source and the drain of the transistor.

A semiconductor chip may include different types of transistors, e.g., relatively low voltage transistors and relatively high voltage transistors. Process architectures for fabricating several different types of transistors on the same chip can be complex, due to different and sometimes competing design goals for the different types of transistors. For example, the thicknesses of gate dielectrics for different types of transistors are often different, depending on, e.g., the operating voltage of the transistor. In these semiconductor chips, on the one hand, a relatively low voltage transistor may have a thin gate dielectric, which can cause excessive leakages between the gate and the substrate and between the gate and the source and the drain. On the other hand, the same semiconductor chip may have a relatively high voltage transistor having a relatively thick gate dielectric, which may provide long-term reliability in operation of the device. When fabricating a large number of transistors on a chip, it can be beneficial to employ a process architecture that forms regular structures on the chip, e.g., regularly repeating fins. However, due to the different physical dimensions of different transistor components, e.g., different gate dielectric thicknesses for different voltage transistors, conventional process architectures for forming fins having a single fin pitch may not be practical, and there may be a need to depart from conventional process architectures for FinFET fabrication.

Thus, there is therefore a need for efficient and cost-effective methods for manufacturing a semiconductor device with different types of transistors.

SUMMARY OF CERTAIN INVENTIVE ASPECTS

An object of the disclosed technology is to provide a semiconductor fin device that solves or at least alleviates at least part of the above discussed drawbacks of prior art.

According to a first aspect of the disclosed technology there is provided a semiconductor fin device comprising at least three fins arranged in parallel and protruding out from a substrate, the fins are separated from each other by shallow trench isolation structures, at least a first and a second of the fins protruding to a level higher than an upper surface of the shallow trench isolation structures, the parallel fins are spaced with a first fin spacing, with at least one third fin arranged in between a first and a second fin, wherein in a non-protruding region the third fin extends to a level below or equal to the upper surface of the shallow trench isolation structures.

The disclosed technology is based on the realization that semiconductor fin devices requiring different fin spacing may be manufactured based on a starting fin spacing, i.e. the first fin spacing, over the substrate. For example, the first fin spacing may be present over the entire substrate which largely facilitates manufacturing when scaling a semiconductor transistor circuit. Transistors may need different thickness of the gate dielectric depending on the operating voltage. This puts constraints on the minimum thickness of the gate dielectric, and for this reason the fins may not be arranged to close to each other because there will not be sufficient space between the fins for either (or both) sufficiently thick gate dielectric or for the gate electrode itself. Thus, scaling will limit the maximum operating voltage of e.g. an I/O transistor. Furthermore, the source and drain which are typically grown by epitaxial growth benefit from being manufactured in/on regular structures due to the complexity of growing the source-drain. By removing, i.e. by etching away, at least part of a third fin enables a non-protruding region between the first and the second fins, thereby a second fin spacing is achieved between the first and the second fins. Thus, the manufacturing process may still benefit from the regular structures of the first pitch.

The fins may be manufactured using standard fin-based processes used for e.g. diodes, varactors, FinFETs or other types of transistors. A fin structure is thus the conduction channel between the source and the drain of a transistor of e.g. FinFET type. The fabrication techniques used for manufacturing the fins, may be standard micro/nano-fabrication techniques such as atomic layer deposition, sputtering, pulsed laser deposition, chemical vapour deposition, etc. The fins are made by e.g. silicon, germanium, or any other semiconductor material.

The fins may have a width and a spacing that advantageously is similar for all fins.

The trench isolation (STI) structures advantageously comprise oxide material (e.g. silicon oxide) providing isolation between neighbouring fins.

According to embodiments of the disclosed technology, the semiconductor fin device may further comprise a conformal first gate dielectric, the conformal first gate dielectric covers at least partially the first and the second protruding fin, and wherein the first gate dielectric may overlap at least part of the third fin in the non-protruding region.

Thus, the first gate dielectric may cover also at least part of the non-protruding region. However, the first gate dielectric is always isolated from any part of the third fin that protrudes from the substrate, i.e. in regions other than the non-protruding region. That the first gate dielectric "overlaps" at least part of the third fin means that there may be other layers in between the first gate dielectric and the third fin. In other words, the first gate dielectric is in this case not in contact with the third fin. However, the first gate dielectric may be in contact with the third fin, thus this possibility is not excluded.

The first gate dielectric covers the first and the second protruding fin where a gate electrode is intended to be grown. For example, the first gate dielectric covers the first and the second protruding fin in parts facing the non-protruding region. That the gate dielectric is conformal should be interpreted as the top surface of the gate dielectric substantially follows the outer shape of the fins.

In one embodiment the first gate dielectric has a thickness corresponding to at least half of the first fin spacing. In other words, the first gate dielectric has a thickness "spacing"/2 (divide by 2).

According to embodiments of the disclosed technology, each of the first and second protruding fin may comprise a source or drain, spaced from the first gate dielectric.

According to embodiments of the disclosed technology, the first gate dielectric is formed by a combination of a previously present oxide layer and an additional gate dielectric.

According to embodiments of the disclosed technology, the semiconductor fin device is a Field Effect Transistor further comprising a source and a drain, in the first and the second fin, wherein the source and the drain are spaced from the first gate dielectric.

The source and drain regions are on opposite sides of the first and the second fins. The fabrication techniques used for manufacturing the source, the drain, or later the gate, or other structures may be standard micro/nano-fabrication techniques such as atomic layer deposition, sputtering, pulsed laser deposition, chemical vapour deposition, etc. For example, the gate is advantageously grown using atomic layer deposition. The source and the drain may be grown by epitaxial growth (e.g. by atomic layer deposition or chemical vapour deposition).

The source region and the drain region may respectively include the region in-between the first and the second fin outside the non-protruding region. In this way, epitaxial growth of the source and drain electrodes is facilitated due to e.g. additional manufacturing steps related to the different spacing of the fins is avoided.

According to embodiments of the disclosed technology, the third fin outside the non-protruding region is a further source or further drain, connected to the respective source or drain of the Field Effect Transistor. In this way, the source and the drain can be placed in a region on the substrate and have a regular structure which allows for optimal conditions for forming the source and drain, i.e., by epitaxial growth.

According to embodiments of the disclosed technology, a cap layer covers at least part of the third fin in the non-protruding region, the cap layer further located in between the substrate and the first gate dielectric.

Thereby, isolation of e.g. the third fin in the non-protruding region is improved. Furthermore, the cap layer may improve the quality of other subsequent materials deposited in the non-protruding region. The cap layer may be made from or comprise e.g. $SiO_2$, SiN, SiON, or SiOCN, or combinations thereof.

According to embodiments of the disclosed technology, there is further provided a semiconductor circuit comprising a first fin device according to any one of the previous embodiments, and further comprising a second fin device comprising: at least two fins arranged in parallel and protruding out from the substrate, the fins separated from each other by shallow trench isolation structures, the parallel fins protruding to a level higher than an upper surface of the shallow trench isolation structures, the parallel fins spaced with a first fin spacing equal to the fin spacing of the first fin device, and; a conformal second gate dielectric on and covering at least part of the two neighbouring parallel fins.

The first fin device is a FinFET transistor suitable for e.g. high voltage applications such as input/output transistors (IO-transistors), electrostatic discharge (ESD), etc. The second fin device may be a low voltage logic FinFET. Thus, the high voltage FinFET benefits from the non-protruding region which allows for thicker gate dielectric and thereby the higher operating voltage without risking e.g. voltage leakage or breakdown throught the gate dielectric. In other words, the first fin device and the second fin device are advantageously FinFET transistors.

Examples of semiconductor fin devices are:
CORE DEVICES, operating at VDD<1V
I/O DEVICES, operating at higher VDD (1.2→10V)
I/O devices can be used to make output buffers, bus drivers, on-chip USB, driver circuits, etc.

According to embodiments of the disclosed technology, the thickness of the first gate dielectric is smaller than half of the first fin spacing.

According to a second aspect of the disclosed technology, there is provided a method for manufacturing a semiconductor fin device, the method comprises the steps of: providing a substrate having thereon at least three fins arranged in parallel and protruding out from a substrate, the fins are separated from each other by shallow trench isolation structures, at least a first and a second of the fins protruding to a level higher than an upper surface of the shallow trench isolation structures, the parallel fins are spaced with a first fin spacing, with at least one third fin arranged in between a first and a second fin, selectively removing at least a portion of the at least one third fin such that each of the at least one third fin is removed to a level below or equal to the upper surface of the shallow trench isolation structures, thereby forming a non-protruding region between the first and the second fin.

The techniques used for removing at least a portion of the at least one parallel third fin may be e.g. ion beam etching, wet etching, dry etching etc., known in the art. The fin structures of which at least a portion is removed may thus leave a remaining portion. However, it is also possible that the fin structures are removed to a level below the upper surface of the shallow trench isolation structures, thus leaving a trench.

According to embodiments of the disclosed technology, the method may further comprise forming a first conformal gate dielectric on and covering at least part of the first and at least part of the second fin.

In embodiments of the disclosed technology, there is a previously present oxide layer on and covering at least part of the first and at least part of the second fin, wherein forming a first conformal gate dielectric comprises forming an additional gate dielectric on the previously present oxide layer to thereby in combination form the conformal gate dielectric.

According to embodiments of the disclosed technology, the first gate dielectric has a thickness corresponding to at least half of the first fin spacing.

According to embodiments of the disclosed technology, the semiconductor fin device is a Field Effect Transistor, the method further comprises forming a source and a drain, in the first and the second fin, wherein the source and the drain are spaced from the first gate dielectric.

According to embodiments of the disclosed technology, the method may further comprise forming in the third fin outside the non-protruding region, a further source or further drain connected to the respective source or drain of the Field Effect Transistor. This step may include the doping of the fin and growing epitaxial source and drain in and or on top of the fin. This may be done in the same steps as the forming of the source and the drain of the first and second fin. This thus obtained regular pattern of the fins for forming the source and drain improves the formation of the source and drain for example during epitaxial growth.

According to embodiments of the disclosed technology, the method may further comprise forming a cap layer that covers at least part of the third fin in the non-protruding region, the cap layer being located in between the substrate and the first gate dielectric.

According to embodiments of the disclosed technology, the parallel fins may be covered by a cover layer on the provided substrate, wherein the step of selectively removing at least a portion of the at least one parallel third fin comprises removing a portion of the cover layer, thereby exposing at least part of one of the at least one third fin in a gate region of the semiconductor fin device, wherein the non-protruding region is formed in the gate region.

Removing a portion of the cover layer facilitates defining which of the fin structures should be part of the subset to be at least partly removed. The cover layer may be at least partly removed using known etching techniques.

According to embodiments of the disclosed technology, the parallel fins and the substrate may be covered by a cover layer wherein the step of selectively removing at least a portion of the at least one third fin comprises covering at least part of the cover layer with a photo resist layer to define the parts to be removed through openings in the photo resist layer, and selectively etching the cover layer and the at least a portion of the at least one third fin through the openings.

Thus, a photo resist layer may for example be spun and cured on top of the cover layer. By defining openings in the photo resist layer the parts of the cover layer and the fin structures within the openings may be etched away. The process of using photo resist may be a standard photolithography process.

According to embodiments of the disclosed technology, the method may further comprise: after removing at least a portion of the at least one third fin, forming a cap layer to cover at least a portion of the non-protruding region. The cap layer may be a dielectric material and acts to close the remaining trenches after the fin structures have been removed to at least below the upper edge portion of the shallow trench isolation structures.

According to embodiments of the disclosed technology, the method may further comprise prior to selectively removing at least a portion of the at least one third fin, a step of forming a drain and a source on at least one of the first or the second fins. The source and the drain may be epitaxially grown using e.g. atomic layer deposition or chemical vapour deposition.

According to embodiments of the disclosed technology, the method may further comprise forming a conformal second gate dielectric on and covering at least part of two parallel fins spaced apart with the first spacing for forming a second fin device, the conformal second gate dielectric covers at least partially the two parallel fins, wherein the thickness of the first gate dielectric is smaller than half of the first fin spacing.

The two parallel fins are associated with an additional semiconductor fin device. For example, a first fin device is a FinFET transistor suitable for e.g. in high voltage applications such as input/output transistors (IO-transistors), electrostatic discharge (ESD), etc., and requires a thicker gate dielectric. The second fin device may be a low voltage logic FinFET which does not require as thick gate dielectric as the first FinFET. Thus, the high voltage FinFET benefits from the non-protruding region which allows for thicker gate dielectric and thereby the higher operating voltage without risking e.g. voltage leakage or breakdown throught the gate dielectric. In other words, the first fin device and the second fin device are advantageously FinFET transistors. The thickness of the second gate dielectric is advantageously smaller than half of the first spacing.

Each of the dielectrics may comprise an oxide. For example for a core FinFET 1 nm $SiO_2$/1.8 nm $HfO_2$ may be used.

Further effects and features of this second aspect of the present disclosed technology are largely analogous to those described above in connection with the first aspect of the disclosed technology.

Further features of, and advantages with, the present disclosed technology will become apparent when studying the appended claims and the following description. The skilled person will realize that different features of the present disclosed technology may be combined to create embodiments other than those described in the following, without departing from the scope of the present disclosed technology.

BRIEF DESCRIPTION OF THE DRAWINGS

This and other aspects of the disclosed technology will now be described in more detail, with reference to the enclosed drawings showing embodiments of the disclosed technology.

FIGS. 3a' and 3b' illustrate a cross-sectional side view and a top-down view, respectively, of an intermediate structure of a semiconductor fin device at one of different stages of fabrication, according to alternative embodiments;

FIGS. 4a' and 4b' illustrate a cross-sectional side view and a top-down view, respectively, of an intermediate structure of a semiconductor fin device at one of different stages of fabrication, according to alternative embodiments;

FIGS. 9a-9i illustrate cross-sectional side views of intermediate structures of a semiconductor fin device at different stages of fabrication, according to embodiments; and FIGS. 9a'-9i' illustrate top-down views corresponding to respective side-views of the intermediate structures illustrated in FIGS. 9a-9i.

DETAILED DESCRIPTION OF CERTAIN ILLUSTRATIVE EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein. These embodiments are rather provided for thoroughness and completeness, and for fully conveying the scope of the invention to the skilled person.

It will be understood that the terms vertical and horizontal are used herein refer to particular orientations of the Figures and these terms are not limitations to the specific embodiments described herein.

The terms first, second and the like in the description are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The terms so used are interchangeable under appropriate circumstances and the embodiments of the invention described herein can operate in other orientations than described or illustrated herein.

Figures 1A, 1B:
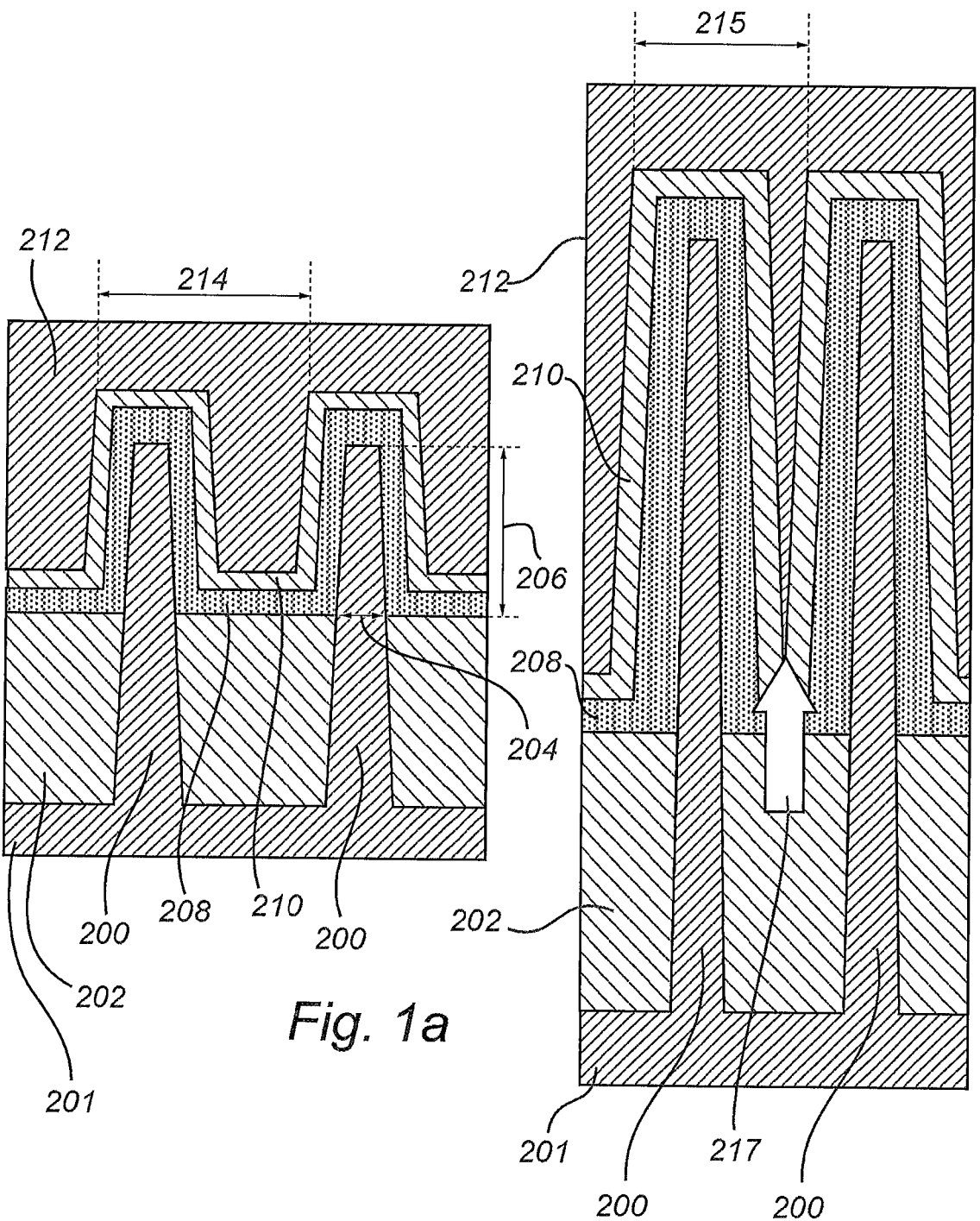
FIGS. 1a-1b illustrate fin devices having different spacings between the fins.

FIGS. 1a and 1b illustrate two typical cross-sections of a fin device illustrating at least one problem when scaling fin devices. There is shown fins 200 formed from a substrate 201 and isolated from each other by shallow trench isolation (STI) structures 202. The fins 200 have a width 204, which may be measured at a vertical level corresponding to the surface of the STI structures 202, and are protruding out of the STI structures 202 by a height 206 and are arranged with a pitch 214. There is further a conformal gate dielectric formed by, for example, an oxide layer 208 (e.g. silicon oxide) and a conformal high-k layer 210 covering two parallel fins protruding from the STI 202. It will be appreciated that, while the illustrated embodiment includes a dual-layer gate dielectric, in some embodiments, a single dielectric may be sufficient. There is also a gate metal 212 covering the gate dielectric 208, 210. In FIG. 1b, the pitch 215 is smaller compared to in FIG. 1a but elements of FIG. 1b are the same as the ones in FIG. 1a. When scaling device technology, the pitch is reduced in this way. As indicated by the arrow 217, there is no room for the gate metal 212 in between the fins 202. However, as apparent from the illustrated embodiment, further reducing the pitch may not allow for formation of a conformal high-k layer 210, much less for formation of a conformal gate dielectric 208, 210. Such may be the case when, e.g., the thickness of the conformal high-k layer 201 or the thickness of the conformal gate dielectric 208, 210 exceeds 50% of the spacing between adjacent fins at the bottom portions of the fins, e.g., at the vertical level corresponding to the surface of the STI structures 202. One potential approach to remedy may be to reduce the thickness of the gate dielectric 208, 210 and/or the thickness of the high-k layer 210. However, this places an undesirable constraint on the fabrication, design and/or operation of the device.

Figure 2A:
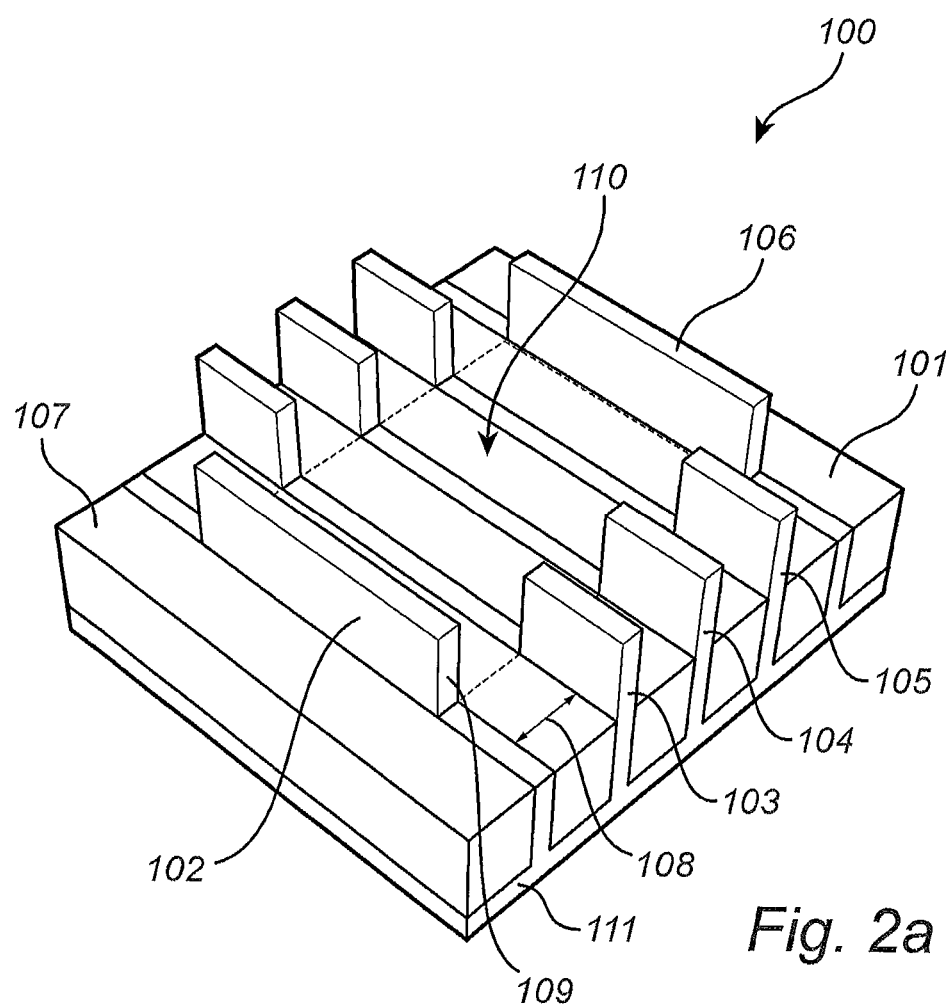
FIG. 2a illustrates a perspective view of a semiconductor fin device according to an example embodiment.

FIG. 2a shows a perspective view of a semiconductor fin device 100 according to an example embodiment of the disclosed technology. In FIG. 2a there is shown a semiconductor fin device 100 comprising at least three parallel fins 102-106 fins each having at least portions that protrude out from the substrate 111 to a level higher than an upper surface 107 of shallow trench isolation structures 101. It will be appreciated by a skilled artisan that, while the illustrated embodiment serves to exemplify the disclosed technology, in reality there may be hundreds of thousands of fins, or even millions or billions of fins on a single substrate. The fins may be formed by, e.g., etching away parts of the substrate, thereby forming STI-trenches between neighbouring fins. The STI-trenches may be filled with a dielectric material, e.g., silicon oxide, to serve as shallow trench isolation between neighbouring fins. The fins are spaced with a first fin spacing 108. Furthermore, there is one or more third parallel fins between a first fin 102 and a second fin 106, in this example embodiment, there are three fins 103-105 between the first 102 and the second fin 106. There is further a non-protruding region 110 where the one or more third parallel fins 103-105 have at least portions that extend to a level below the upper surface 107 of the shallow trench isolation (STI) 101 on the substrate 111. The spacing of fins is advantageously a regular spacing in a repeating pattern. The fins 102-106 advantageously have substantially the same width 109.

As shown in FIG. 2a the fins 102-106 are arranged separated by the shallow trench isolation structures 101. The shallow trench isolation are made according to shallow-trench isolation processing known in the art. The fins 102-106 extend substantially vertically from the substrate 111.

Figure 2B:
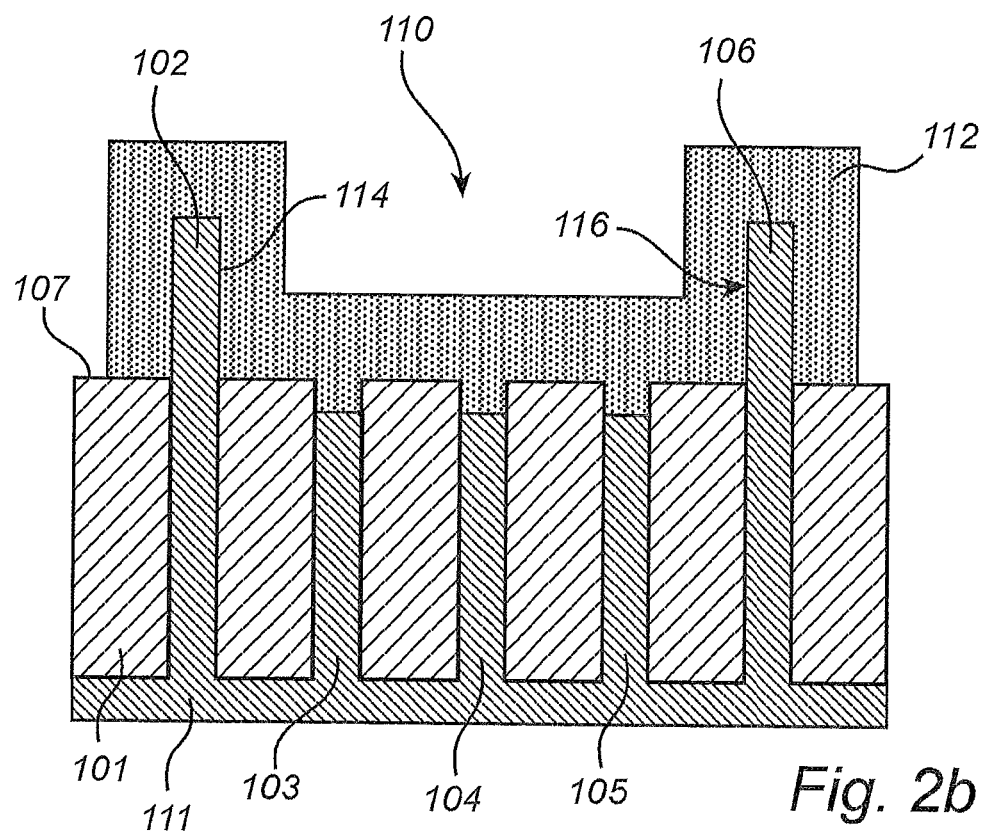
FIGS. 2b and 2c illustrate a cross-sectional side view and a top-down view, respectively, of an intermediate structure of a semiconductor fin device at one of different stages of fabrication, according to embodiments.
Figure 2C:
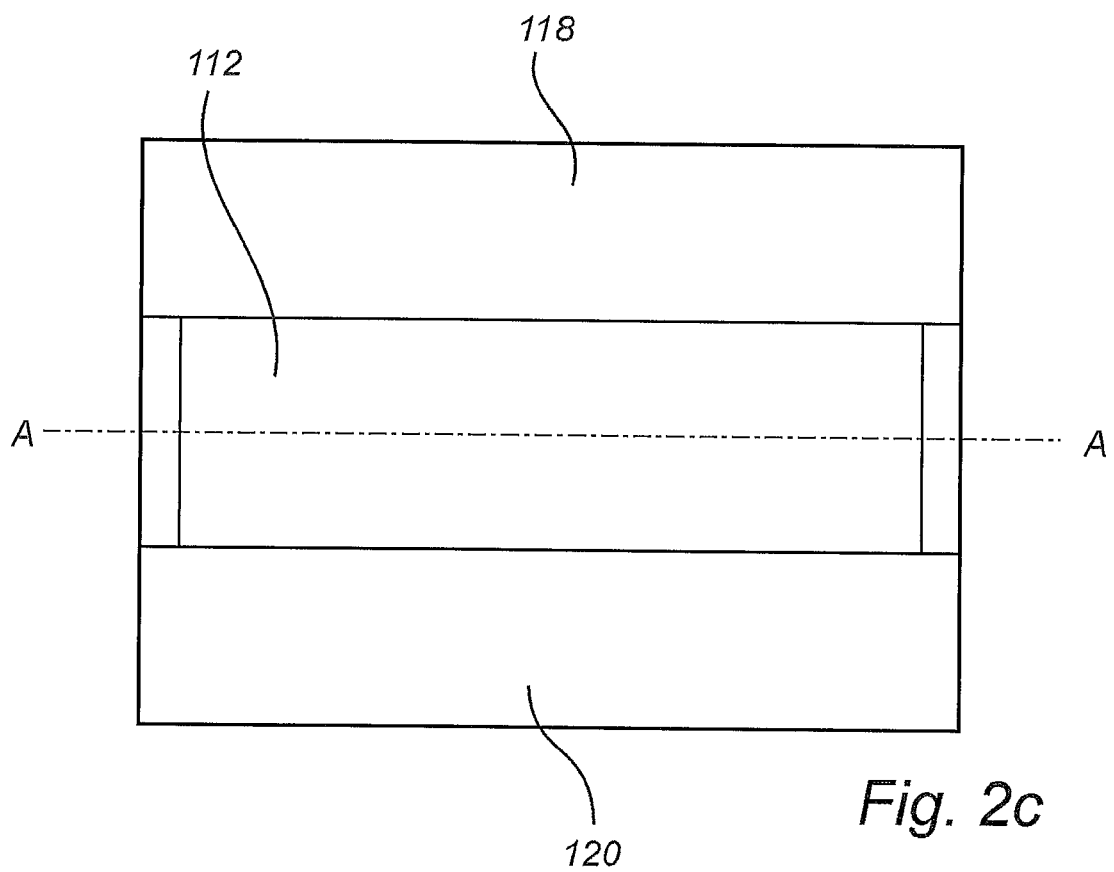

FIG. 2b show a cross-section in cutline A of the top view of the semiconductor fin device depicted in FIG. 2c. In FIG. 2b there is shown that a first gate dielectric 112 covers at least part of the first fin 102 and the second fin 106. According to various embodiments, the fins have a width in the range of 4 to 15 nanometers, and a fin height (vertical to the substrate) in the range of 20 to 100 nanometers. According to various embodiments, the first fin spacing 108 between fins is between 5 and 100 nanometers. The first gate dielectric 112 is conformal with the first and second fins 102 and 106. Furthermore, in this example embodiment, the first gate dielectric 112 that covers the first fin 102 is spaced apart from the first gate dielectric 112 that covers the second fin 106 on the sidewalls 114, 116 of the first and second fins 102, 106. Furthermore, in this example embodiment, the first gate dielectric 112 overlaps at least parts of the third fins 103-105 in the non-protruding region 110. It will be appreciated that the first gate dielectric 112 is isolated from parts of the third fins 103-105 that protrude from the substrate, i.e., in regions other than in the non-protruding region 110 where the first gate dielectric 112 may be in contact with the third fins 103-105. However, the first gate dielectric 112 may also be separated from the third fins 103-105 by additional layers (e.g. cap layer discussed below) of other materials. The first gate dielectric 112 may have a thickness corresponding to at least half of the first fin spacing 108. The conformal first gate dielectric 112 may optionally be a combination of a gate dielectric deposited in step S706 and a previously present oxide layer on and covering at least part of the first and of the second fin.

The semiconductor fin device 100 may advantageously be used to form a FinFET transistor. For example, the fins 102, 106 may be connected to a source and a drain formed in source and drain regions 118, 120 (both regions 118 and 120 may comprise a source and a drain) which may be formed on opposite sides of the non-protruding region 110. The source and the drain regions 118, 120 may include the parts of the protruding third fins (not shown in FIG. 2c) between the first 102 and the second fins 106.

Figure 5A:
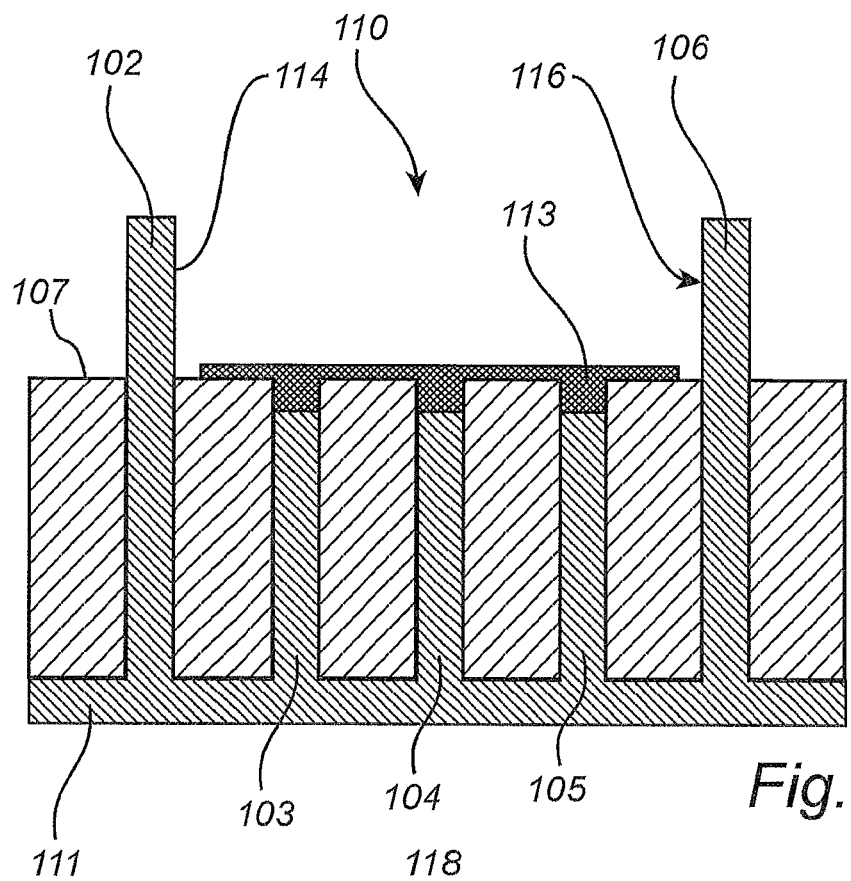
FIGS. 5a and 5b illustrate a cross-sectional side view and a top-down view, respectively, of an intermediate structure of a semiconductor fin device at one of different stages of fabrication, according to embodiments.

Optionally, the non-protruding region 110 is covered by a dielectric cap layer 113 (see FIG. 5a). The cap layer improves the isolation between the first gate dielectric and the third fins in the non-protruding region. Furthermore, the presence of the cap layer may improve growth of e.g. the first gate dielectric in the non-protruding region 110. The cap layer may be formed of or comprise e.g. $SiO_2$, SiN, SiON, or SiOCN, or combinations thereof.

In the following, a method for manufacturing a semiconductor fin device will be described with reference to FIGS. 3a-7b.

Figure 3A:
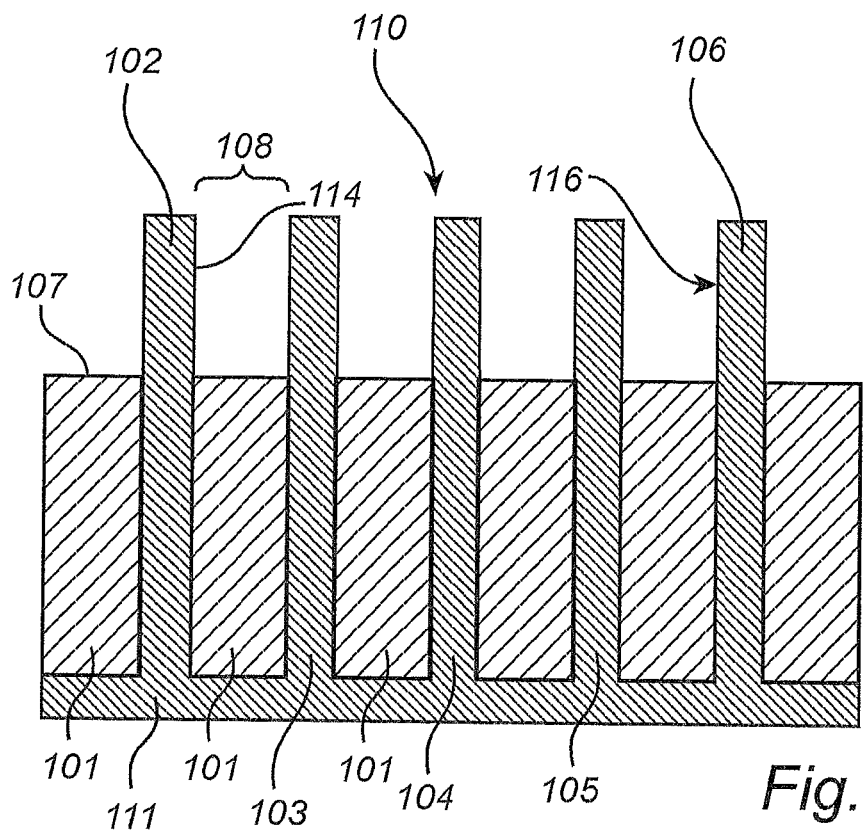
FIGS. 3a and 3b illustrate a cross-sectional side view and a top-down view, respectively, of an intermediate structure of a semiconductor fin device at one of different stages of fabrication, according to embodiments.
Figure 3B:
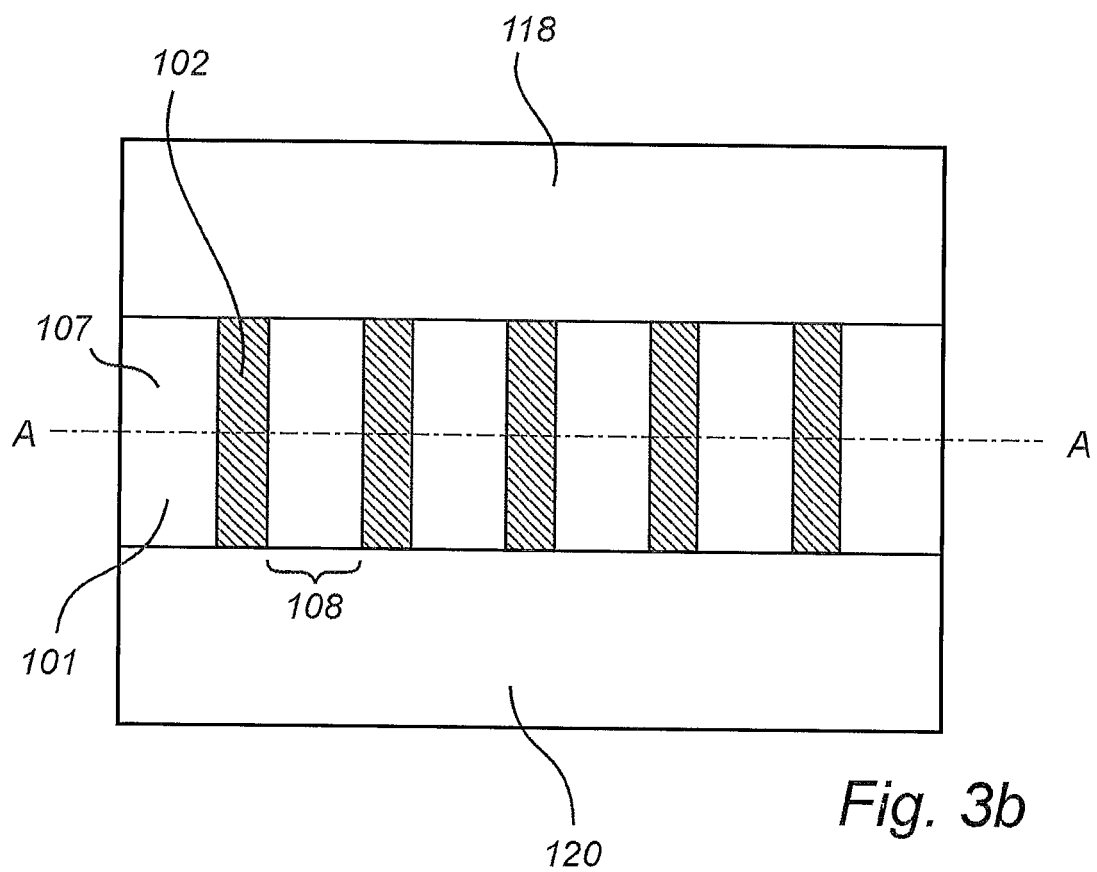
Figure 3A:
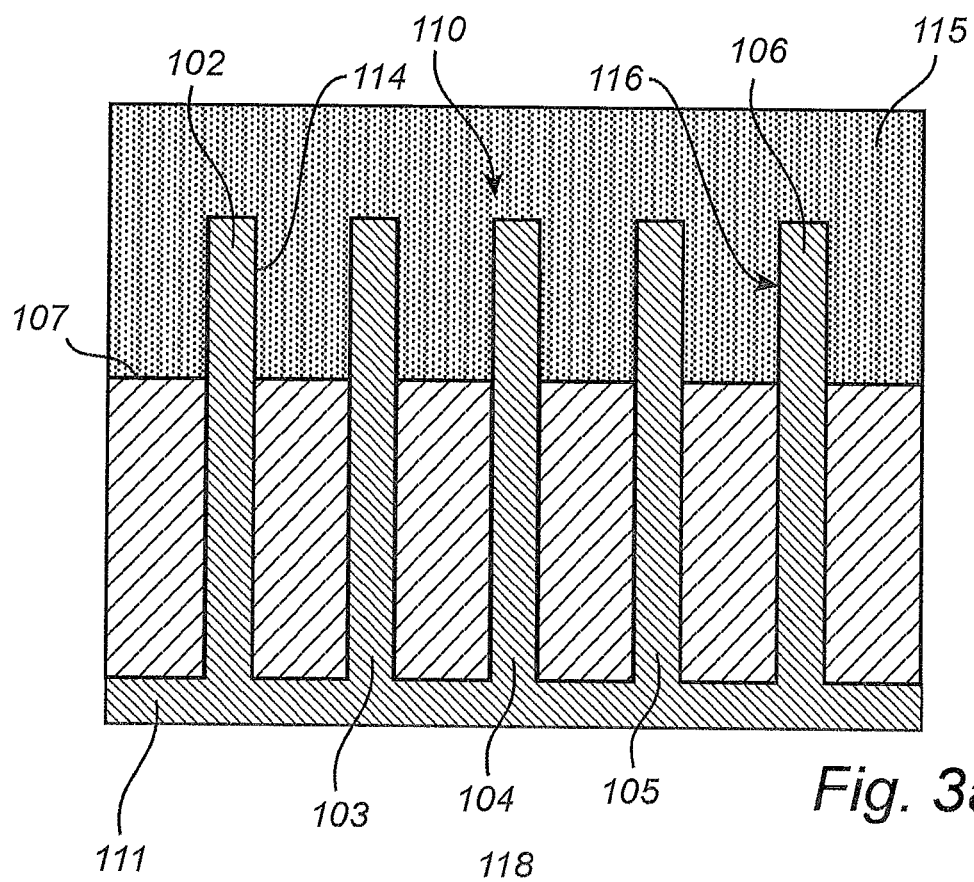
Figure 3B:
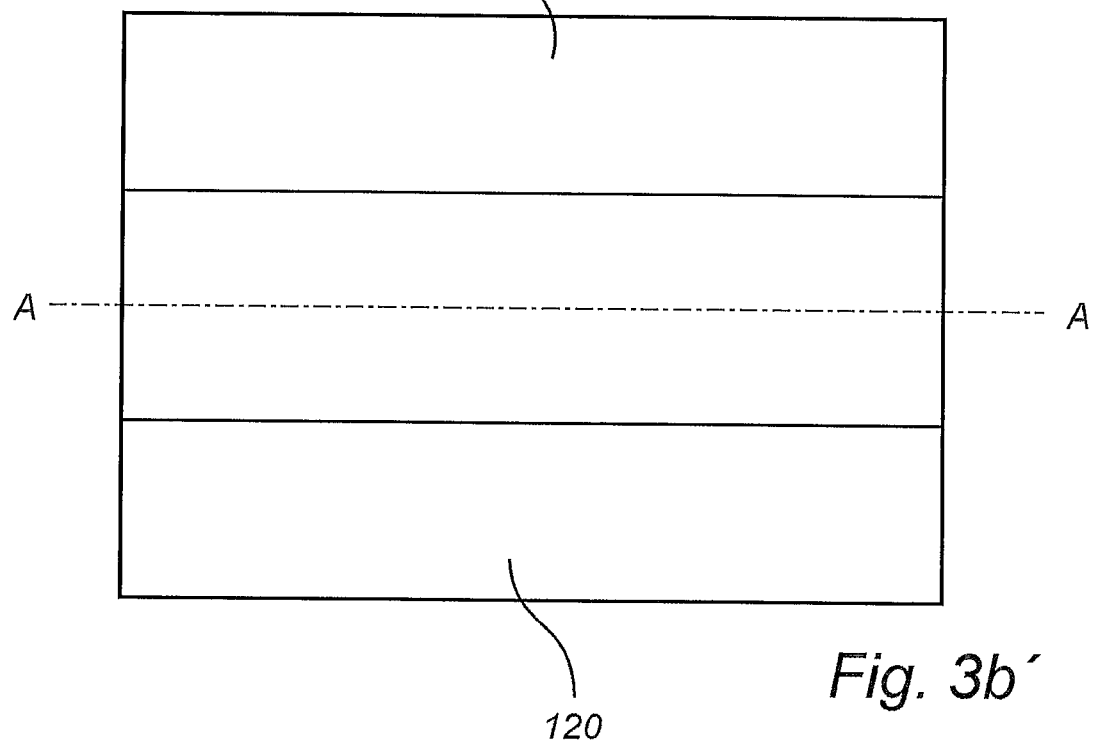

FIG. 3a show a side view in cutline A of the top view in FIG. 3b of a substrate 111 having at least three fins 102-106 in and protruding out from the upper surface 107 of the shallow trench isolation structures 101. The fins 102-106 are spaced with a first spacing 108 and there are one or more third fins 103-105, in this case three fins 103-105, between a first 102 and a second 106 fin. There is further shown a source and a drain region 118, 120 in the top view shown in FIG. 3b. The source and the drain region may be covered by a hard mask during manufacturing of the semiconductor fin device. The hard mask may be removed towards the end of the manufacturing process. As shown in FIG. 3a' and FIG. 3b', the shallow trench isolation structures 101 and the fins 102-106 may be covered by a cover layer 115. The cover layer may be made from e.g., photoresist, or silicon-nitride.

Figure 4A:
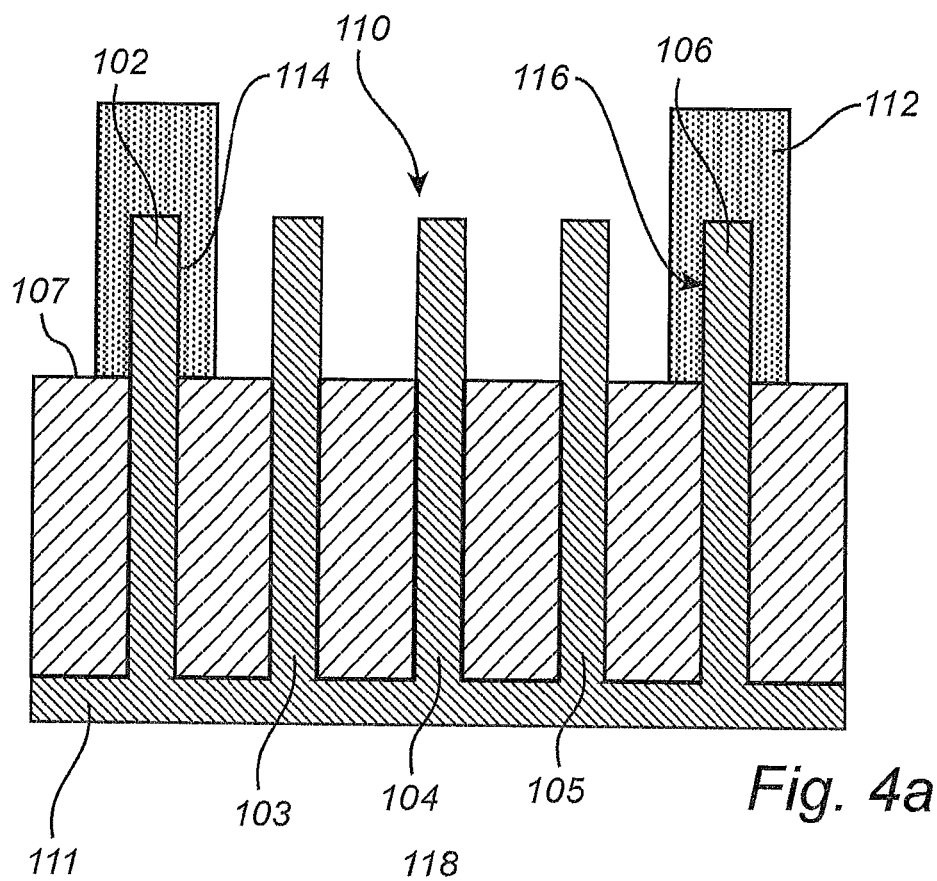
FIGS. 4a and 4b illustrate a cross-sectional side view and a top-down view, respectively, of an intermediate structure of a semiconductor fin device at one of different stages of fabrication, according to embodiments.
Figure 4B:
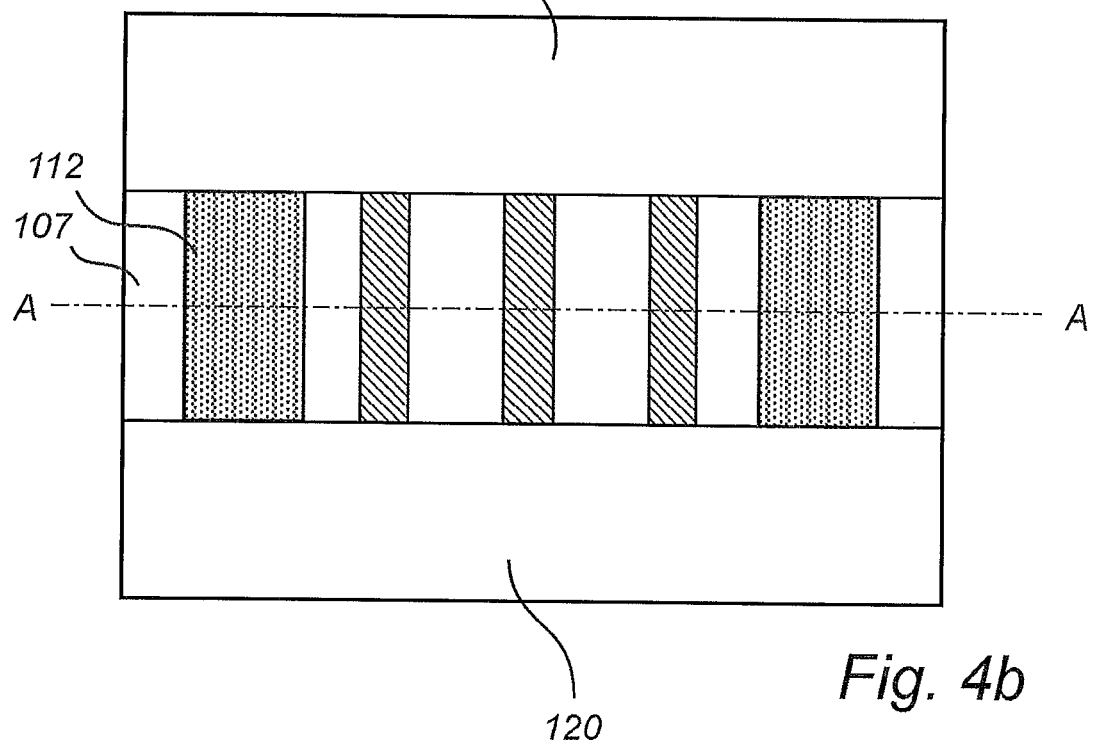

Next, at least a portion of the at least one of the one or more third fins 103-105 is selectively removed such that the one or more third parallel fins 103-105 extend to below the upper surface 107 of the shallow trench isolation structures 101. This may be done by, in the case a cover layer 115 is used, first removing the cover layer 115 in the region 110 where the fins 103-105 are to be removed as is shown in FIGS. 4a-4b. In this way, the first and second fins 102, 106 are still covered by the cover layer 115, e.g., photoresist and the third parallel fins 103-105 are exposed in the region 110. Other embodiments are possible, where a cover layer 115 is not used. For example, in processes where the cover layer 115 is not used, the fins may be selectively removed using other means, e.g., wet or dry etching techniques. Subsequently, the fins in the region are removed by, e.g., wet or dry etching techniques. After removal of the one or more third parallel fins 103-105, as shown in the side view in FIG. 4a' in cutline A of the top view in FIG. 4b', there is formed a non-protruding region 110 between the first and second parallel fins 102, 106. In processes where the cover layer 115 is not used, the first and second fins 102, 106 are exposed after the selective removal of the one or more third parallel fins 103-105, as shown in FIGS. 4a'-4b'.

Figure 5B:
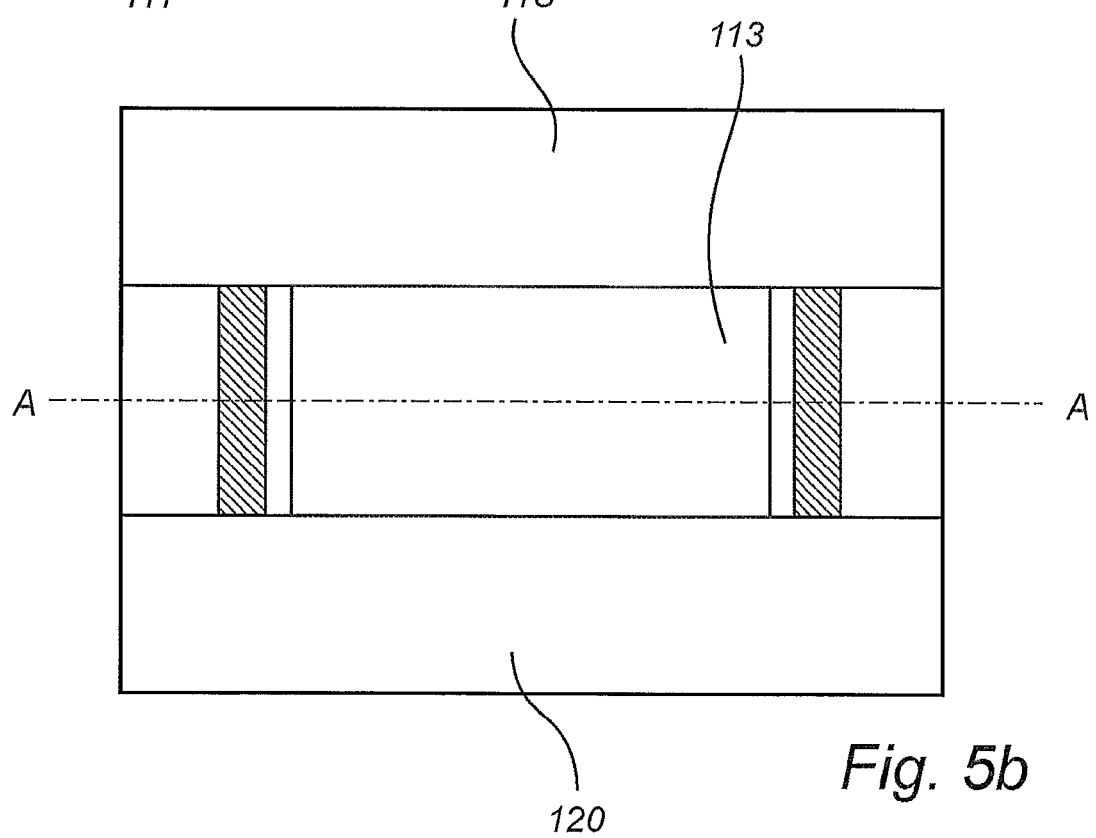

Optionally, a cap layer 113 is formed overlapping the one or more third parallel fins 103-105 as shown in FIGS. 5a-5b. The cap layer 113 may be used to cover the parts of the fins, in the non-protruding region 110, remaining after partial removal. As described with reference to FIGS. 5a-5b, isolation of the one or more third fins 103-105 in the non-protruding region 110 is improved by the cap layer 113. Furthermore, the presence of the cap layer 113 may improve the quality of other subsequent materials deposited in the non-protruding region 110. The cap layer 113 may be formed of or comprise e.g. $SiO_2$, SiN, SiON, or SiOCN, or combinations thereof.

Figure 6A:
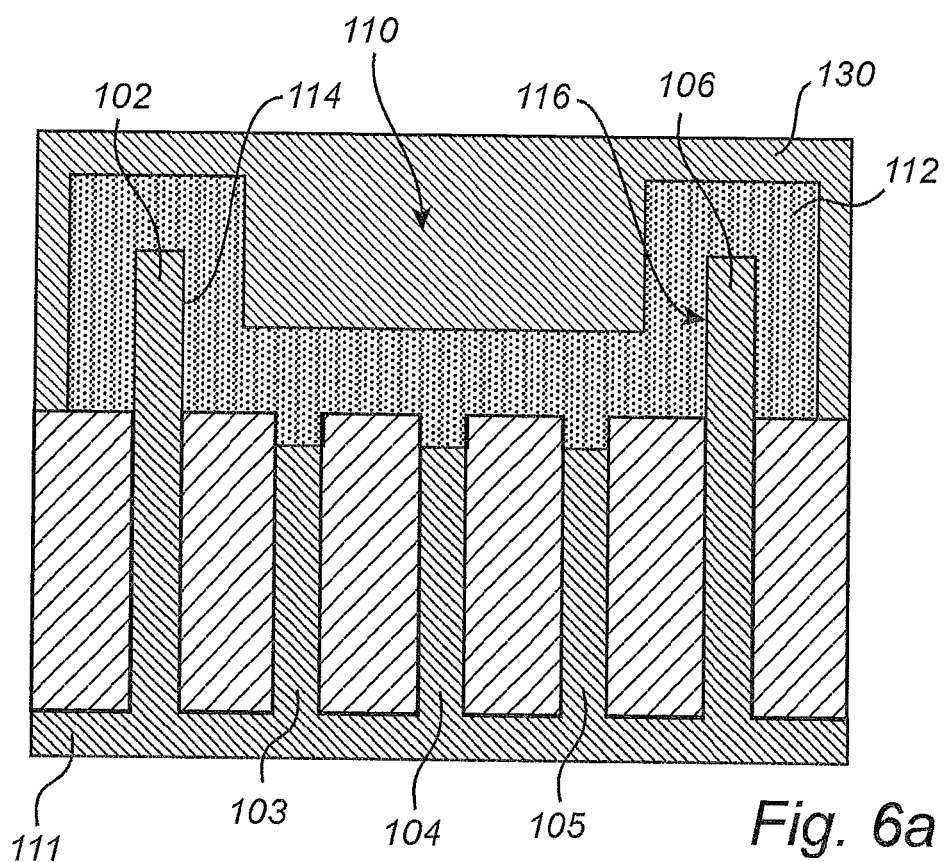
FIGS. 6a and 6b illustrate a cross-sectional side view and a top-down view, respectively, of an intermediate structure of a semiconductor fin device at one of different stages of fabrication, according to alternative embodiments.
Figure 6B:
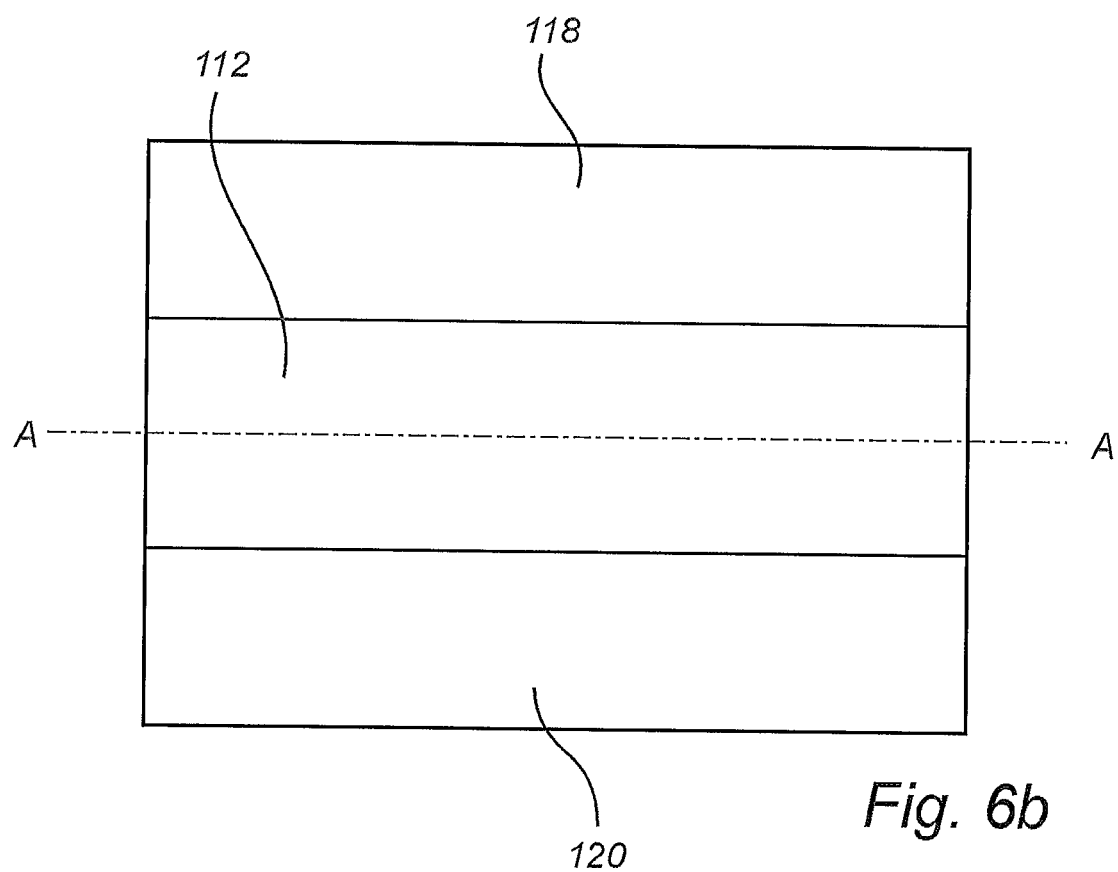

In a subsequent step, a first gate dielectric 112 and subsequently a gate electrode 130 is formed over the first fin 102 and the second 106 fin and in the non-protruding region 110. This is shown in FIGS. 6a-6b showing a side view (6a) in cutline A of the top view in FIG. 6b.

Figure 8:
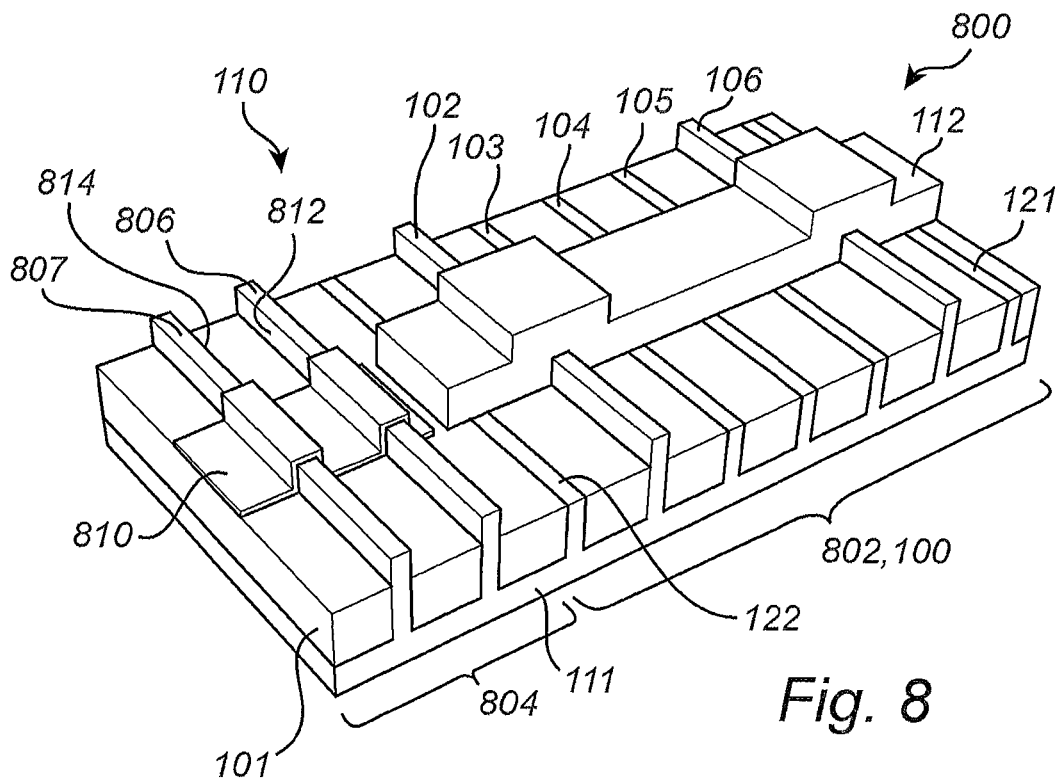
FIG. 8 illustrates an example semiconductor circuit according to embodiments.

It may occur that the first gate dielectric is to be deposited, and there may be additional fins on the outer side of the first 102 and/or the second fin 106, where the outer side refers to a side opposite the non-protruding region with respect to the respective fins 102 and 106. Such additional fins 121, 122 are illustrated in FIG. 8 outside the respective fin 102 and 106. The fins 121, 122 on the outer side are arranged with the same spacing as the spacing 108 of the fins 102-106. In such case, the fins 121, 122 on the outer side(s) of the first 102 and/or the second fin 106 also needs to be selectively removed such that the fins 121, 122 on the outer sides extend to below the upper surface 107 of the shallow trench isolation structures 101. This selective removal is needed for accomodation of the gate dielectric on the outer side of the first 102 and the second fin 106.

Figure 7:
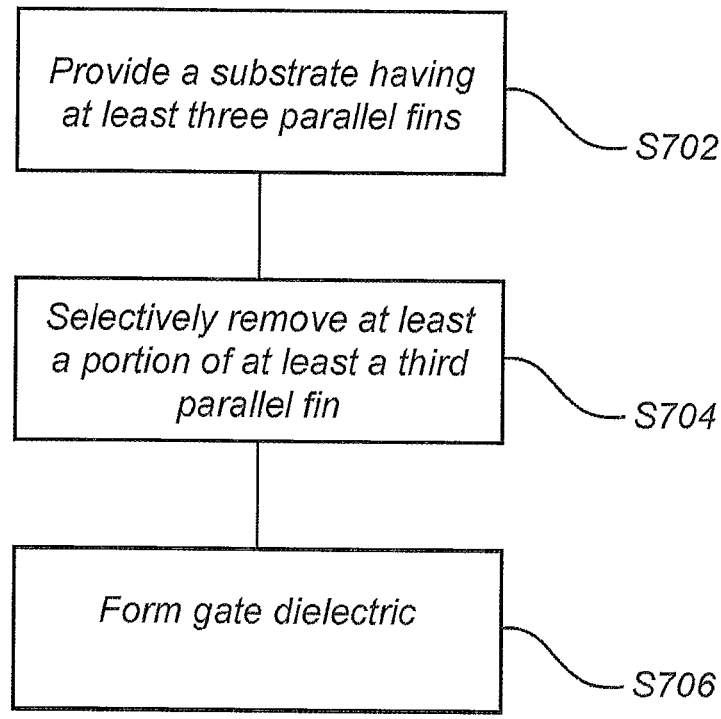
FIG. 7 illustrates a method of fabricating a fin device, according to embodiments.

FIG. 7 provides a flow-chart illustrating a method of manufacturing a semiconductor fin device, according to an example embodiment of the disclosed technology. In a first step S702, there is provided a substrate having thereon at least three parallel fins isolated by respective shallow trench isolation structures on the substrate, the fins being spaced with a first fin spacing, with at least one parallel third fin, between a first and a second fin. Subsequently in step S704, at least a portion of the at least one parallel third fin is selectively removed such that each of the at least one parallel third fin is removed to a level at least below an upper surface of the shallow trench isolation structure, thereby forming a non-protruding region between the first and the second fin. Thereafter, forming (S706) a conformal first gate dielectric on and covering at least part of the first and of the second fin, the conformal first gate dielectric covers at least partially the first and the second fin. The conformal first gate dielectric may optionally be a combination of a gate dielectric deposited in step S706 and a previously present oxide layer on and covering at least part of the first and of the second fin.

FIG. 8 illustrates a semiconductor circuit 800 according to an example embodiment of the disclosed technology. The semiconductor circuit 800 comprises a first semiconductor fin device 802 similar to the one described with reference to FIGS. 2a-2c. The semiconductor circuit 800 additionally includes a fin 121 on the outer side of the second fin 106 and a fin 122 on the outer side of the first fin 102, and also a second semiconductor fin device 804 arranged on the same substrate 111 as the first semiconductor fin device 802. The second semiconductor fin device 804 comprises at least two parallel fins 806, 807 which protrude from the substrate 111. The at least two parallel fins 806, 807 have the same first spacing 108 of the fins 102-106 of the first semiconductor fin device 802. The at least two parallel fins 806, 807 have the same and height above the STI as the protruding fins 102 and 106 of the first semiconductor fin device 802. Furthermore, there is a second gate dielectric 810, which covers at least part of two neighbouring protruding fins 806, 807. In this example embodiment, the second gate dielectric 810 is conformal at covers at least partially three sides of each of the two fins, similar to what is shown with reference to the first fin device 100 in FIGS. 2a-2c. Furthermore, also similar the first gate dielectric of the first fin device 100 (see, e.g., FIGS. 2a-2c), the second gate dielectric 810 of the second semiconductor fin device that covers the (first) fin 806 is spaced apart from the second gate dielectric 810 that covers the (second) fin 807 on the sidewalls 812, 814 of the fins 806, 807. In other words, the second gate dielectric does not entirely fill the space (volume) between the fins 806-807. The first fin device has fins with a first spacing and a non-protruding region 110 such that a second fin spacing is formed, and the second fin device has fins with the first spacing. In particular, the first fin device may operate at higher voltages (for example, 2 volts, 2.5 volts, 3 volts, or higher), thereby having a thicker gate dielectric. The second fin device may operate at lower voltages, e.g., below 1 volt, or at most half the operating voltage of the first fin device. As previously explained, the thicker gate dielectric may put constraints on the spacing because there has to be space for the gate metal. The non-protruding region 110 enables this space for the first device be e.g. an I/O FinFET transistor. The second fin device which may require thinner gate dielectric may still benefit from the first spacing of the fins in the substrate. For example, for the semiconductor circuit shown in the example embodiment of FIG. 8, the first gate dielectric 112 is thicker than the second gate dielectric 810. The first gate dielectric may have a thickness corresponding to at least half of the first fin spacing.

FIGS. 9a-9i illustrates the manufacturing steps for removing semiconductor fins to create a non-protruding region.

Figure 9A:
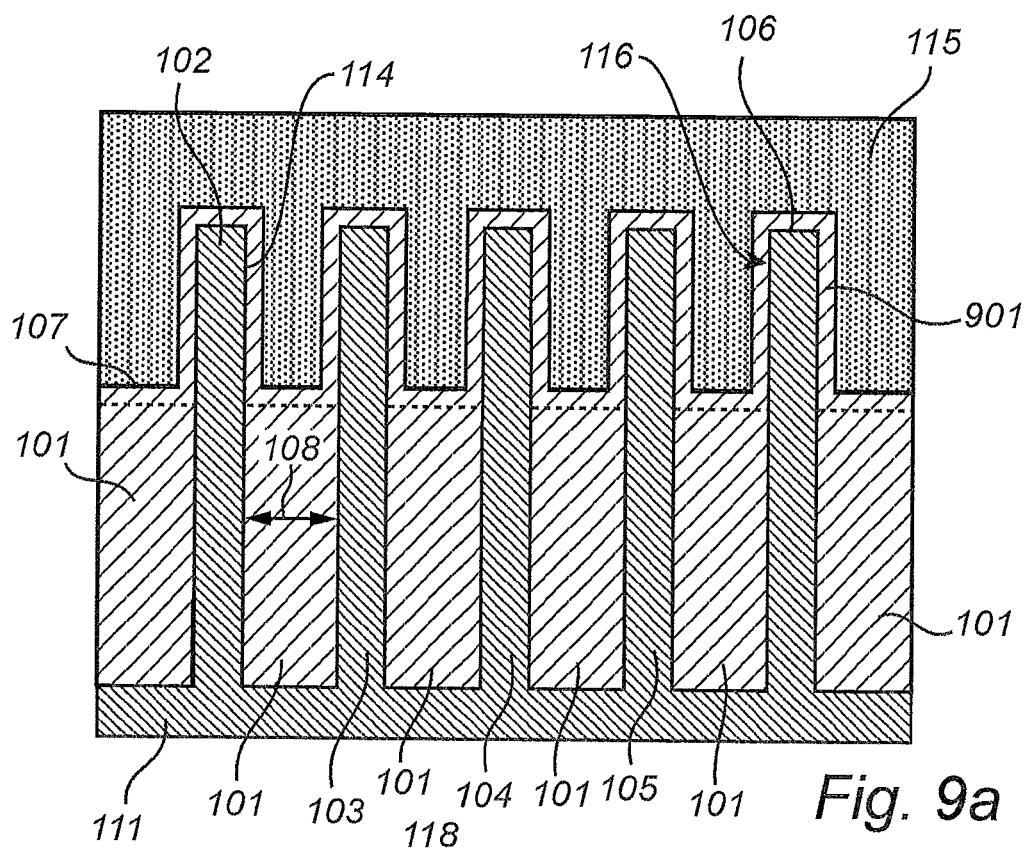
Figure 9A:
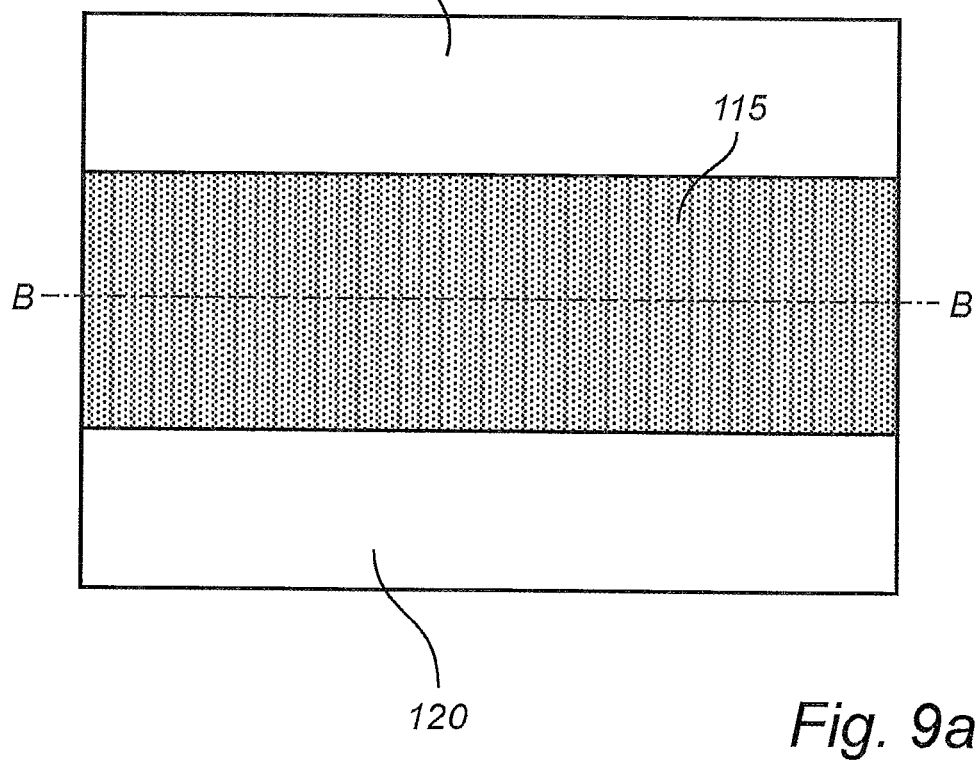

FIGS. 9a-9a' shows a side view of a substrate 111 having at least three fins 102-106 in and protruding out from the upper surface 107 of the shallow trench isolation structures 101. The fins 102-106 are spaced with a first spacing 108. There is further shown a source and a drain region 118, 120 in the top view shown in FIG. 3b. The source and the drain region may be covered by a hard mask during manufacturing of the semiconductor fin device. The hard mask may be removed towards the end of the manufacturing procedure. The fins 102-106 may be covered by a cover layer 115. The cover layer may be made from e.g. photoresist, or silicon-nitride, or a dummy polymer. There is further optionally an oxide layer 901 which covers the fins 102-106. The oxide layer is conformal with the fins 102-106. The oxide layer 901 may be deposited conformally on the upper surface 107 of the STI 101, as illustrated by dashed lines in FIG. 9a. The oxide layer 901 may later form part of a dielectric layer for the metal gate. In case there is no oxide layer 901, the gate dielectric is deposited directly on the fins. Thus, the gate dielectric is formed in a subsequent manufacturing step. In the subsequent drawings, the case in which an oxide layer 901 is present is described.

As shown in FIGS. 9b-9b', using lithography, a protective layer 903 may be formed on the e.g. dummy polymer 115. The protective layer 903 is formed in positions on the dummy polymer 115 above selected fins, in this case above fins 103 and 105 which are intended to not be etched.

Figure 9C:
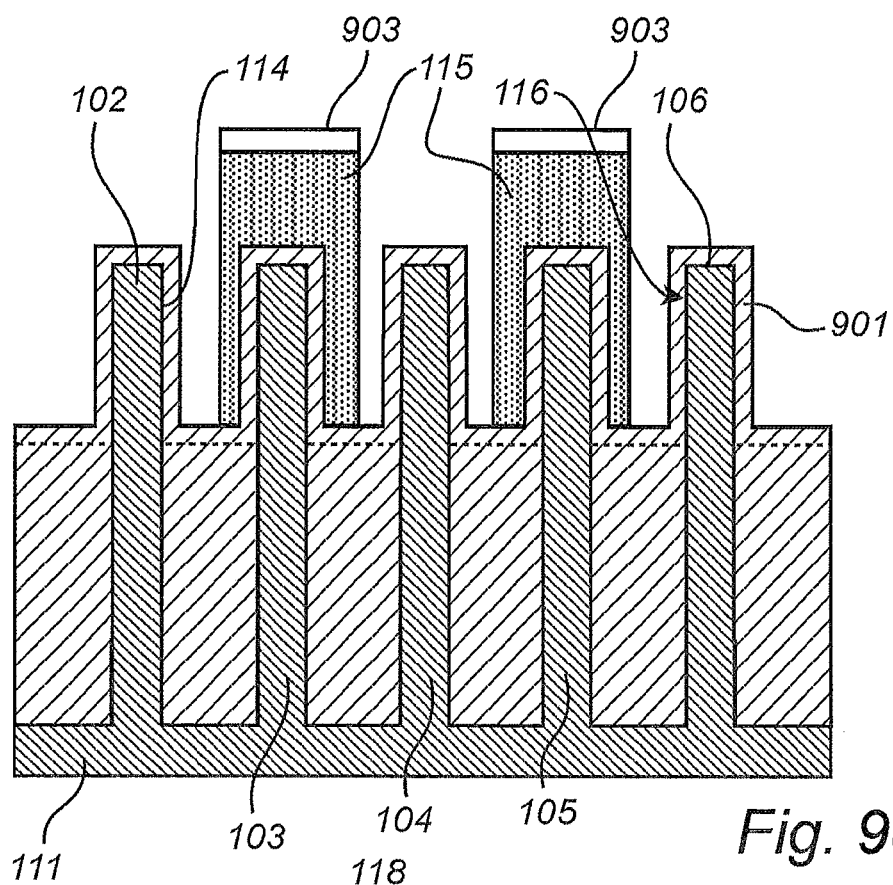
Figure 9C:
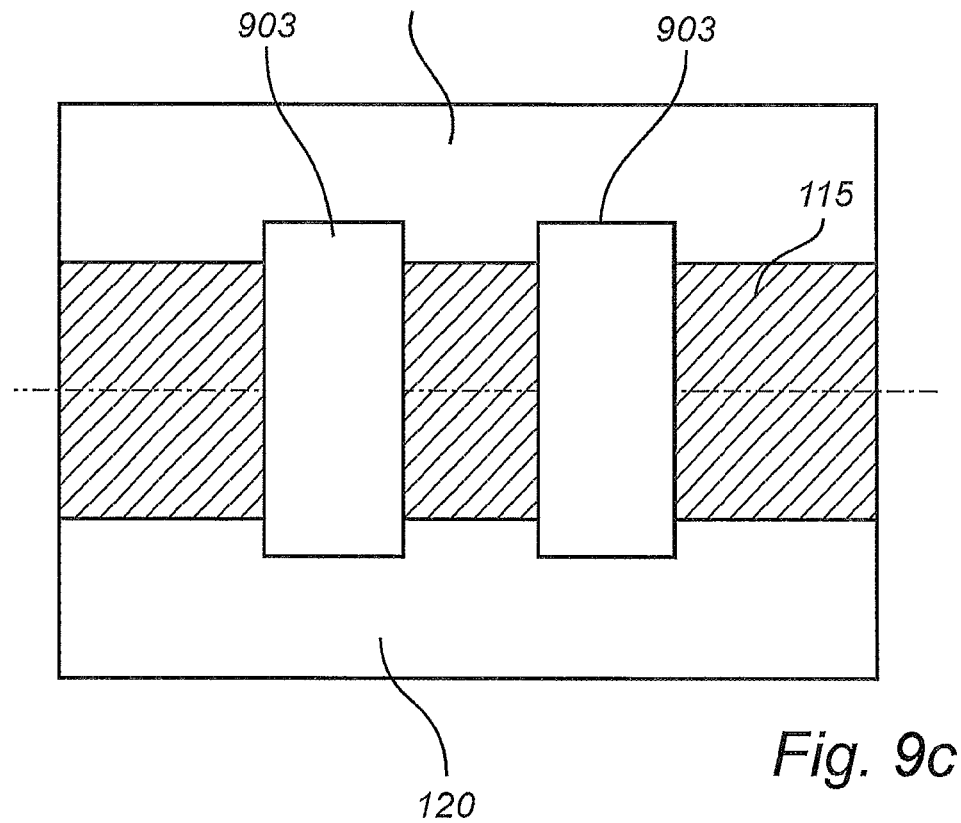

Subsequently, shown in FIGS. 9c-9c', the dummy polymer 115 is removed (using means known to the skilled person) where the protective layers 903 does not cover the dummy polymer 115. This way, the fins 102, 104, and 106 which were covered by the dummy polymer but not covered by the protective layers 903 are now exposed. The exposed fins 102, 104, and 106 are still covered by the oxide layer 901.

Figure 9D:
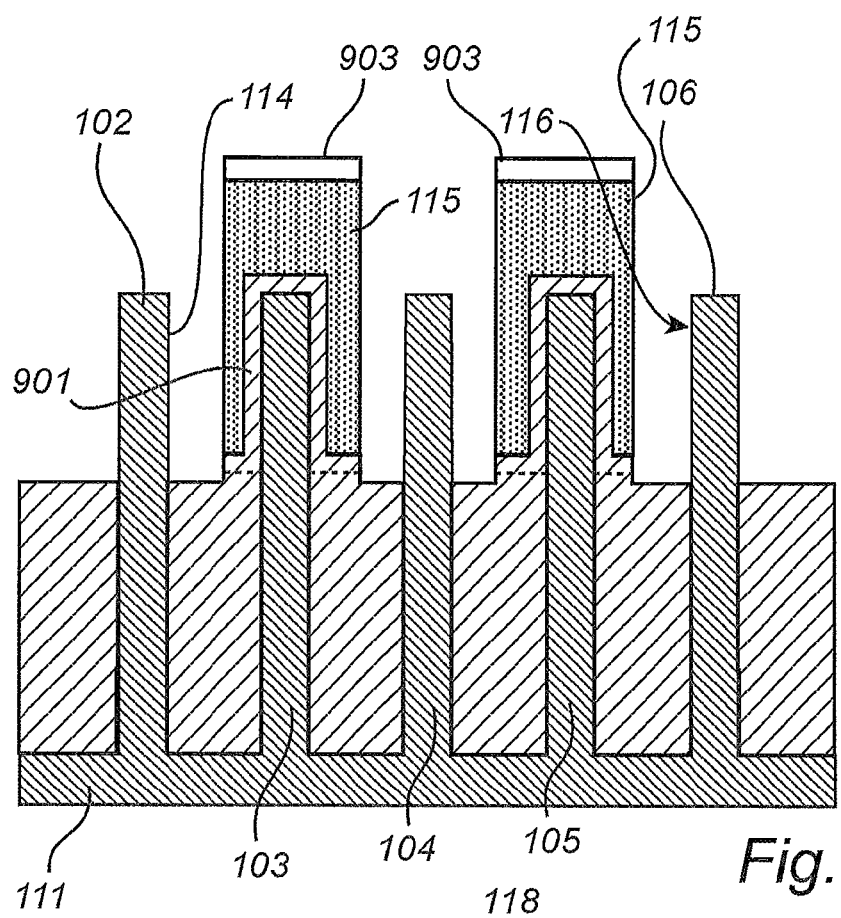
Figure 9D:
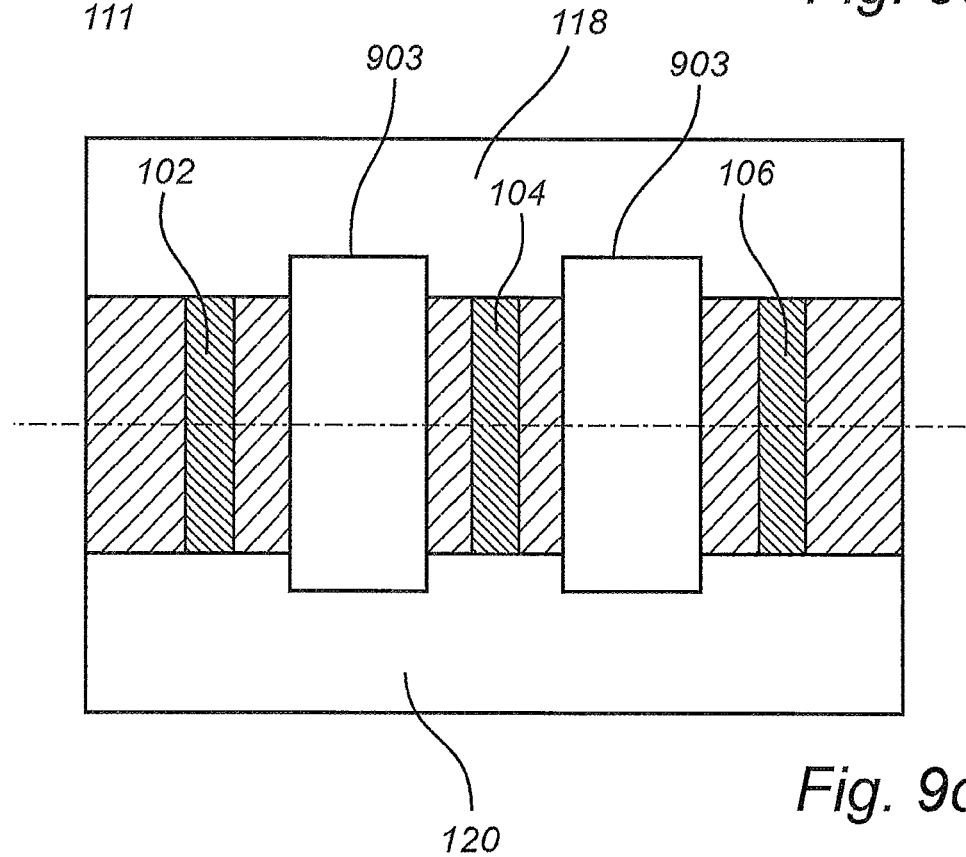

The optional oxide layer 901 may be removed (FIGS. 9d-9d') in the areas where the protective layer 903 does not cover the oxide layer 901. As shown in FIGS. 9d-d', the oxide layer 901 may be removed in selected areas so that the fins 102, 104, and 106 are not anymore covered by the oxide layer 901. The removal of the oxide layer 901 may be performed by conventional means known to the skilled person.

Figure 9E:
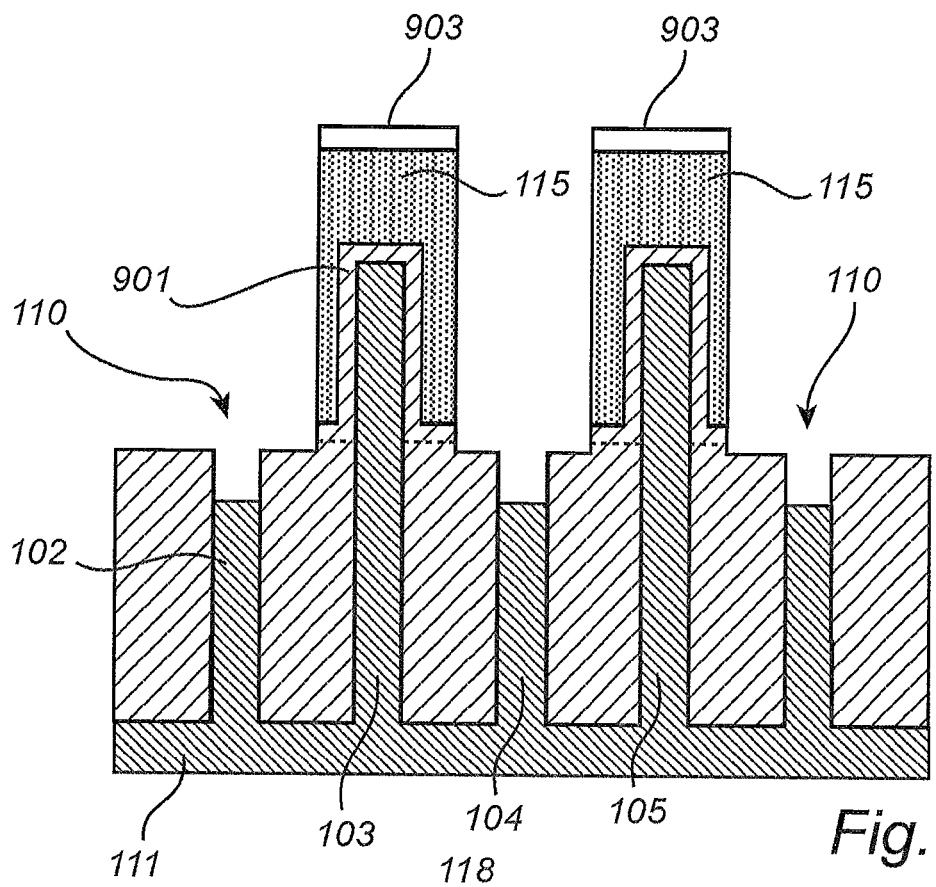
Figure 9E:
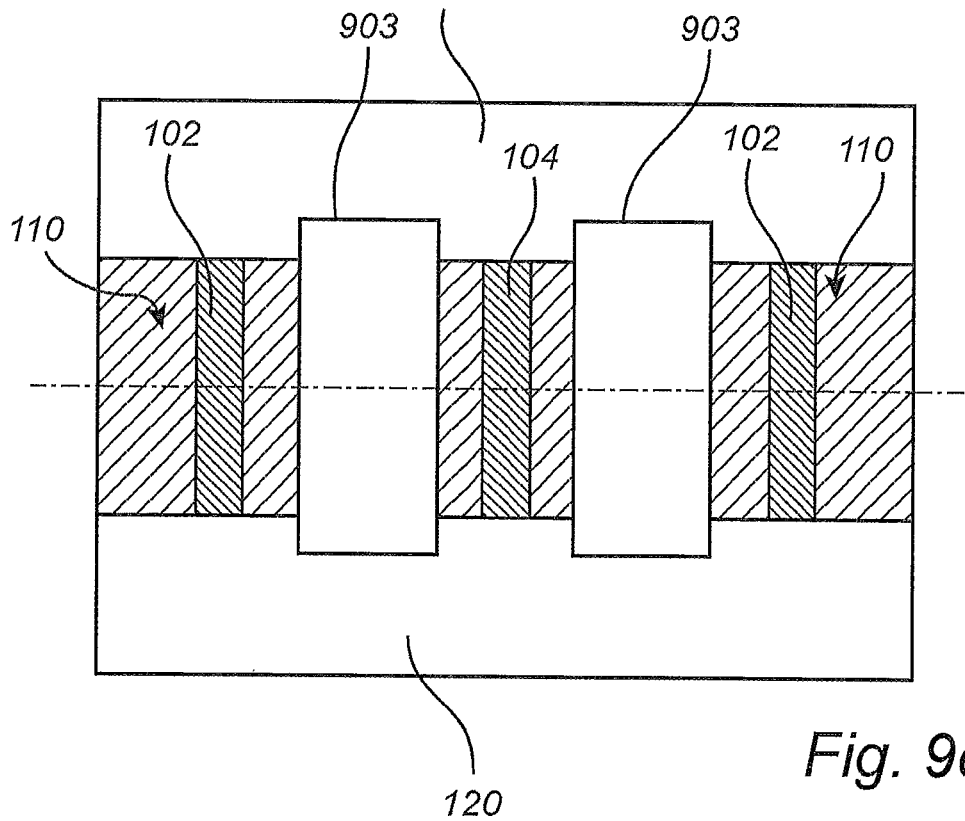

Subsequently, in reference to FIGS. 9e-9e' the fins (fins 102, 104, and 106) which are exposed are etched causing at least partial removal of the fins 102, 104, and 106 to below an upper surface 107 of the shallow trench isolation structures 101. This forms a non-protruding region 110 where the fin 104 have been at least partly removed. The non-protruding region 110 is formed between the fins 103 and 105. Note that similar non-protruding regions (not numbered) are formed where fins 102 and 106 have been at least partly removed.

Figure 9F:
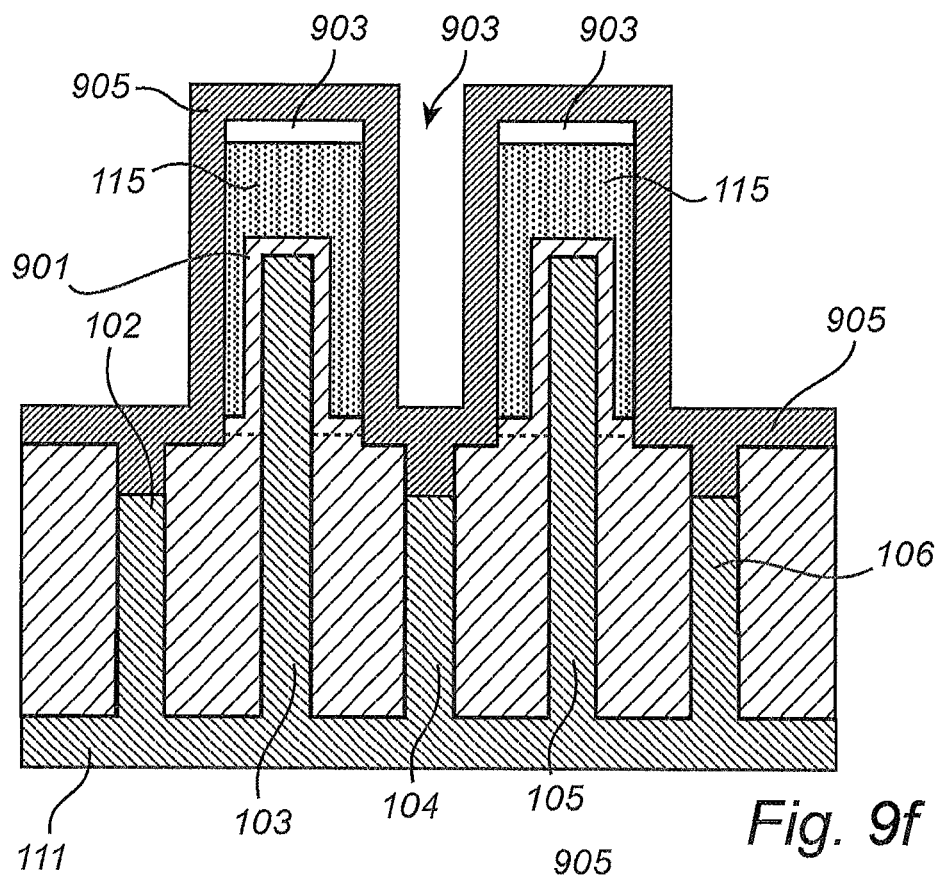
Figure 9F:
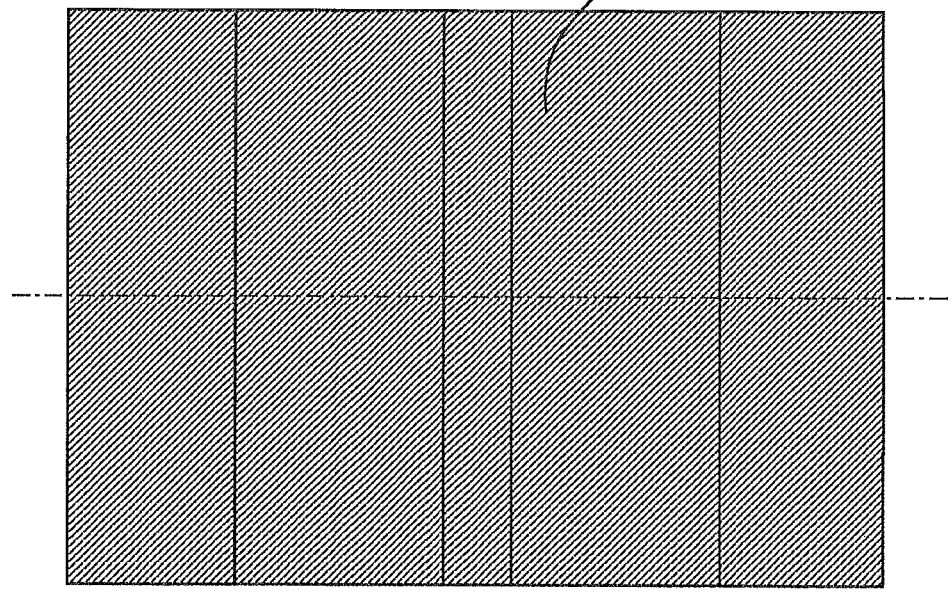
Figure 9G:
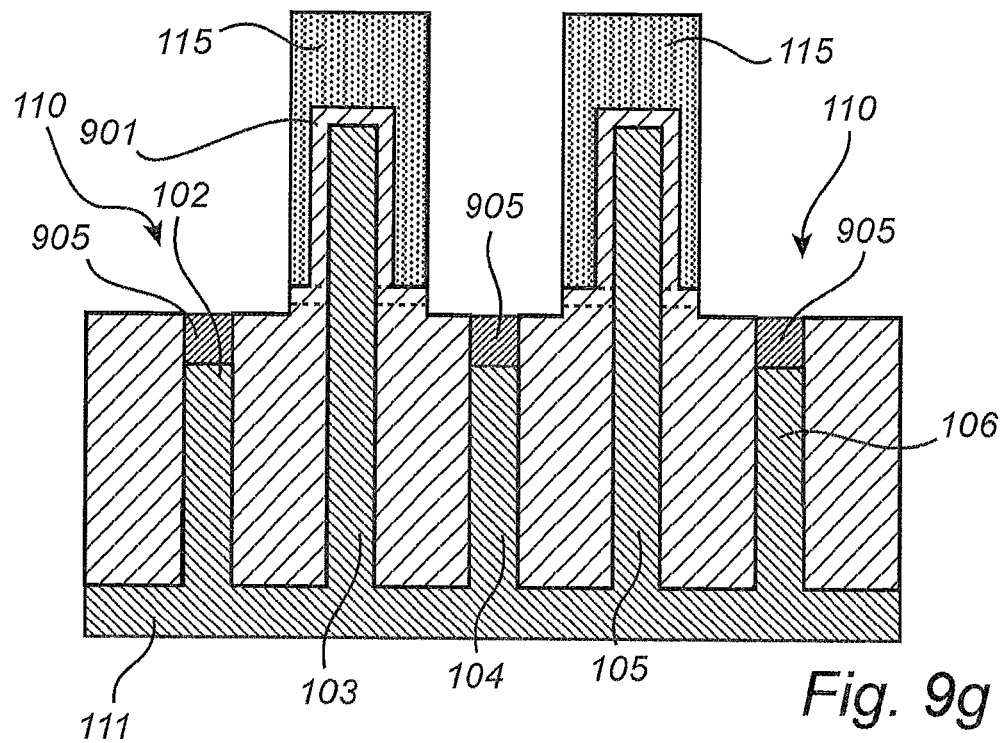
Figure 9G:
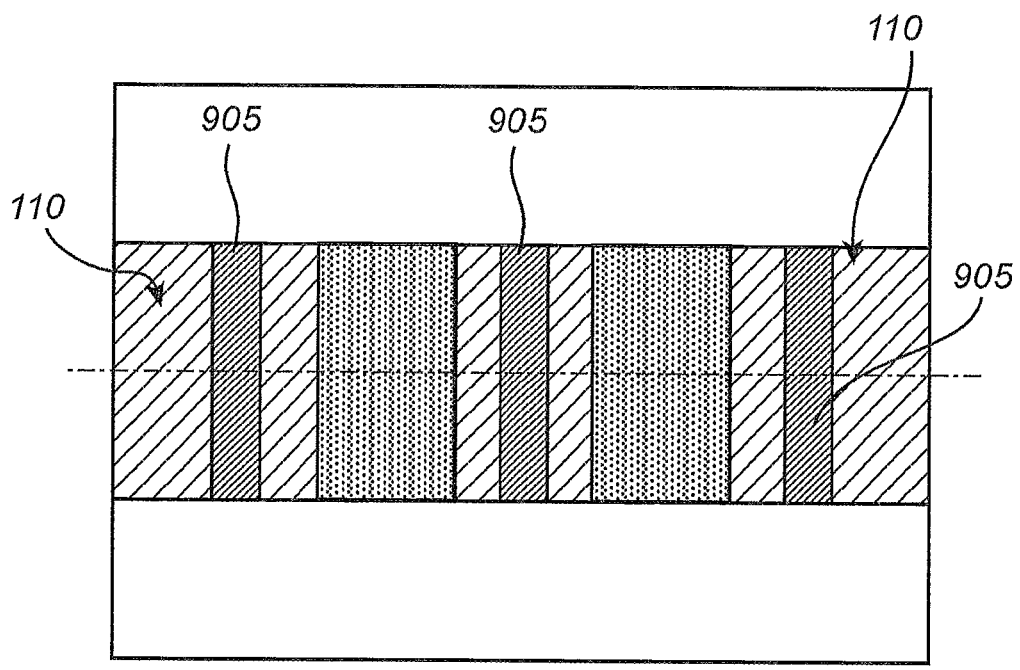

Referring to FIGS. 9f-9f', a second oxide layer 905 (e.g. a cap layer 113, see FIG. 5a) is deposited and covers the shallow trench isolation structures 101, the protective layer 903 and the part where the oxide layer 901 was previously removed. The second oxide layer 905 may have a thickness of about 5 nm. In a subsequent etching step (FIG. 9g-9g'), the second oxide layer 905 is etched and partly removed so that the second oxide layer 905 fills the trenches formed where the at least partly removed fins 102, 104, and 106 are located. The second oxide layer 905 may in this way be made level with the upper surface 107 of the shallow trench isolation structures 101.

Referring to FIGS. 9h-h', the dummy polymer 115 is removed. Thereby, the fins 103 and 105 are exposed apart from the optional oxide layer 901 which covers the fins 103 and 105.

Figure 9I:
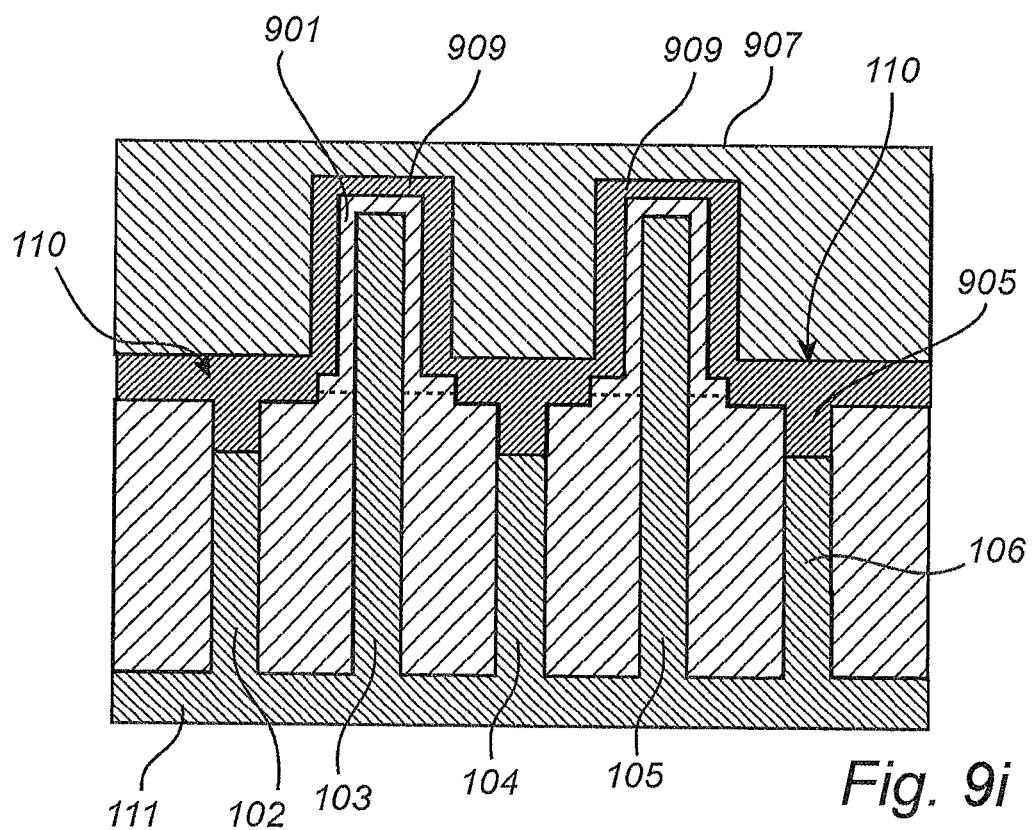
Figure 9I:
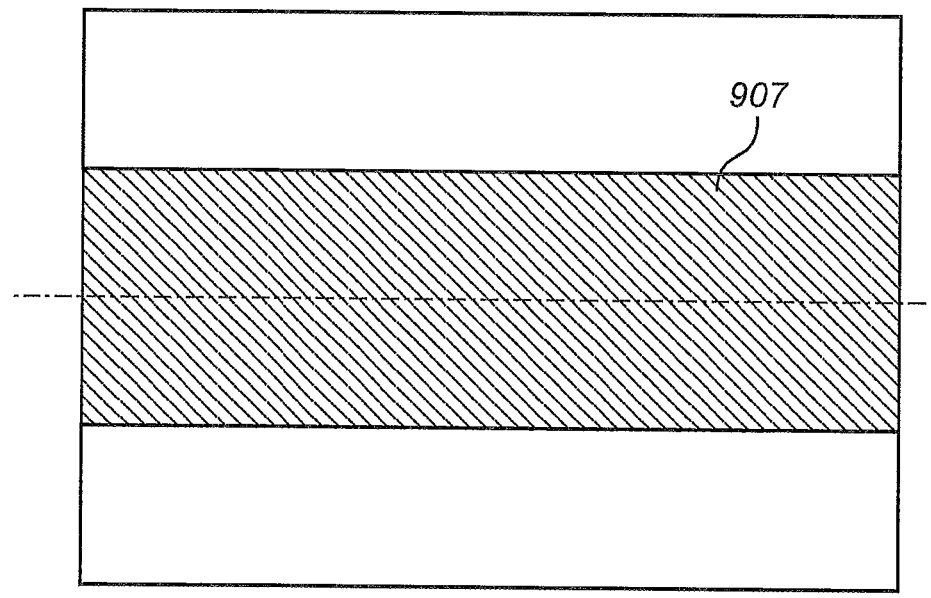

Referring to FIGS. 9i-9i', a gate-stack 907 is formed to cover at least part of the fins 102-106. The gate stack may include e.g. high-k material, barrier metal layer(s), gate metal, etc. (see, e.g., FIGS. 1a-1b). The oxide layer 901 may serve as a first gate dielectric 909 in combination with an additional dielectric 911.

Forming of a gate dielectric 909 may thus be performed in at least two ways. A first option being without having the oxide layer 901. In this case (not shown) the first dielectric 909 is formed by the additional gate dielectric 911 on and covering at least part of the first (fin 103) and at least part of the second fin (105). As a second option, the first oxide layer 901 is previously present on the fins 102-106, the conformal first gate dielectric 909 is formed as a combination between the oxide layer 901 and the additional dielectric 911.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Also two or more steps may be performed concurrently or with partial concurrence. Further, the steps of the method may be performed in an order different from what has been disclosed. Such variation will depend on the process hardware systems chosen and on designer choice. All such variations are within the scope of the disclosure. Additionally, even though the invention has been described with reference to specific exemplifying embodiments thereof, many different alterations, modifications and the like will become apparent for those skilled in the art.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor fin device comprising:
at least three fins including first to third fins protruding from a substrate and arranged to extend in parallel in a first direction and further arranged to laterally alternate in a second direction with a plurality of shallow trench isolation structures, wherein each of the at least three fins is separated from an immediately adjacent one of the at least three fins by a first fin spacing and by one of the shallow trench isolation structures, and wherein immediately adjacent ones of the shallow trench isolation structures are discretely separated from each other in the second direction by one of the at least three fins,
wherein at least a portion of each of the first fin and the second fin of the at least three fins vertically protrudes to substantially the same vertical level higher than upper surfaces of the shallow trench isolation structures immediately adjacent to a respective one of the each of the first fin and the second fin, and
wherein the third fin is formed laterally between the first fin and the second fin in the second direction, the third fin having a non-protruding region which extends vertically to a level below or equal to upper surfaces of the shallow trench isolation structures immediately adjacent to the third fin; and
a first gate dielectric that is conformal with respect to topmost surfaces and upper sidewall portions of the first and second fins,
wherein the first gate dielectric has the same composition at portions contacting each of the first, second and third fins,
wherein the first gate dielectric overlaps and contacts a topmost portion of the third fin in the non-protruding region and immediately adjacent ones of the shallow trench isolation structures with respect to the third fin, and wherein the first gate dielectric contacting sidewalls of the first fin and sidewalls of the second fin has a thickness measured in the second direction that is at least half of the first fin spacing.

2. The semiconductor fin device according to claim 1, wherein the semiconductor fin device is a fin field effect transistor (finFET) further comprising a source and a drain, wherein the source and the drain are laterally spaced from each other by the first gate dielectric.

3. The semiconductor fin device according to claim 2, wherein regions of the third fin outside the non-protruding region comprise one or both of a further source connected to the source and a further drain connected to the drain.

4. A semiconductor circuit comprising the semiconductor fin device according to claim 1 and further comprising a second fin device, the second fin device comprising:
at least two fins arranged to extend in parallel in the first direction and laterally separated from each other in the second direction by second shallow trench isolation structures having the first fin spacing, the at least two fins protruding out from the substrate to a vertical level higher than the upper surface of the second shallow trench isolation structures; and
a conformal second gate dielectric on and covering at least part of two of the at least two fins.

5. The semiconductor circuit according to claim 4, wherein the thickness of the second gate dielectric is smaller than half of the first fin spacing.

6. The semiconductor circuit according to claim 4, wherein the semiconductor first fin device and the second fin device are fin field effect transistors.

7. The semiconductor fin device according to claim 1, wherein the first gate dielectric is a single layer gate dielectric.

8. The semiconductor fin device according to claim 1, wherein the first gate dielectric is a dual layer gate dielectric.

9. The semiconductor fin device according to claim 1, wherein the non-protruding region of the third fin extends vertically to a level below the upper surfaces of the shallow trench isolation structures immediately adjacent to the third fin.

10. The semiconductor fin device according to claim 2, wherein the finFET is a high voltage finFET.

11. The semiconductor fin device according to claim 10, wherein an operational voltage of the finFET is at least 1V.

12. A semiconductor fin device comprising:
at least three fins including first to third fins protruding from a substrate and arranged to extend in parallel in a first direction and further arranged to laterally alternate in a second direction with a plurality of shallow trench isolation structures, wherein each of the at least three fins is separated from an immediately adjacent one of the at least three fins by a first fin spacing and by one of the shallow trench isolation structures, and wherein immediately adjacent ones of the shallow trench isolation structures are discretely separated from each other in the second direction by one of the at least three fins,
wherein at least a portion of each of the first fin and the second fin of the at least three fins vertically protrudes to substantially the same vertical level higher than upper surfaces of the shallow trench isolation structures immediately adjacent to a respective one of the each of the first fin and the second fin, and
wherein the third fin is formed laterally between the first fin and the second fin in the second direction, the third fin having a non-protruding region which extends vertically to a level below or equal to upper surfaces of the shallow trench isolation structures immediately adjacent to the third fin; and
a first gate dielectric that is conformal with respect to topmost surfaces and upper sidewall portions of the first and second fins,
wherein the first gate dielectric has the same composition at portions contacting each of the first, second and third fins, and
wherein the at least three fins comprise a plurality of third fins including the third fin, wherein each of the third fins is formed laterally between the first fin and the second fin in the second direction, and wherein each of the third fins has a respective non-protruding region which extends vertically to a level below or equal to upper surfaces of the shallow trench isolation structures immediately adjacent to a respective one of the third fins.

13. The semiconductor fin device according to claim 12, wherein the third fins are consecutively arranged in the second direction between the first fin and the second fin.

14. A method of fabricating a semiconductor fin device, the method comprising:
   forming at least three fins including first to third fins protruding from a substrate and arranged to extend in parallel in a first direction and further arranged to laterally alternate in a second direction with a plurality of shallow trench isolation structures, wherein each of the at least three fins is separated from an immediately adjacent one of the at least three fins by a first fin spacing and by one of the shallow trench isolation structures, and wherein immediately adjacent ones of the shallow trench isolation structures are discretely separated from each other in the second direction by one of the at least three fins,
   wherein forming the at least three fins comprises forming the first fin and the second fin such that at least a portion of each of the first fin and the second fin vertically protrudes to substantially the same vertical level higher than upper surfaces of the shallow trench isolation structures immediately adjacent to a respective one of the each of the first fin and the second fin,
   wherein forming the at least three fins further comprises forming the third fin laterally between the first and the second fin in the second direction, and
   selectively removing at least a portion of the third fin such that the third fin is removed to a level below or equal to the upper surfaces of the shallow trench isolation structures immediately adjacent to the third fin, thereby forming a non-protruding region between the first fin and the second fin; and
   forming a first gate dielectric that is conformal with respect to topmost surfaces and upper sidewall portions of the first and second fins,
   wherein the first gate dielectric has the same composition at portions contacting each of the first, second and third fins,
   wherein the first gate dielectric overlaps and contacts a topmost portion of the third fin in the non-protruding region and immediately adjacent ones of the shallow trench isolation structures with respect to the third fin, and wherein the first gate dielectric contacting sidewalls of the first fin and sidewalls of the second fin has a thickness measured in the second direction that is at least half of the first fin spacing.

15. The method according to claim 14, wherein the first gate dielectric has a thickness corresponding to at least half of the first fin spacing.

16. The method according to claim 14, wherein the semiconductor fin device is a field effect transistor, the method further comprising forming a source and a drain in each of the first fin and the second fin, and wherein the source and the drain are laterally spaced from the first gate dielectric.

17. The method according to claim 16, further comprising forming in the third fin outside the non-protruding region one or both of a further source connected to the source and a further drain connected to the drain.

* * * * *

UNITED STATES PATENT AND TRADEMARK OFFICE
CERTIFICATE OF CORRECTION

PATENT NO. : 11,114,435 B2  
APPLICATION NO. : 15/382376  
DATED : September 7, 2021  
INVENTOR(S) : Geert Hellings et al.

It is certified that error appears in the above-identified patent and that said Letters Patent is hereby corrected as shown below:

In the Specification

In Column 2, Line 48, after "The" insert --shallow--.

In Column 4, Line 10, delete "throught" and insert --through--.

In Column 5, Line 2, delete "and or" and insert --and/or--.

In Column 6, Line 5, delete "throught" and insert --through--.

In Column 10, Line 22, delete "accomodation" and insert --accommodation--.

In Column 11, Line 65, delete "d'," and insert --9d',--.

In Column 12, Line 20, delete "FIG." and insert --FIGS.--.

In Column 12, Line 27, delete "h'," and insert --9h',--.

In the Claims

In Column 14, Claim 6, Line 17, after "semiconductor" delete "first".

Signed and Sealed this  
Eighth Day of February, 2022

Drew Hirshfeld  
*Performing the Functions and Duties of the*  
*Under Secretary of Commerce for Intellectual Property and*  
*Director of the United States Patent and Trademark Office*